United States Patent [19]

Dunham et al.

[11] Patent Number: 4,831,725

[45] Date of Patent: May 23, 1989

[54] GLOBAL WIRING BY REMOVAL OF REDUNDANT PATHS

[75] Inventors: Bradford Dunham, White Plains; Jerome B. Hickson, Jr., Yorktown Heights; Hirsh Lewitan, Monsey, all of N.Y.

[73] Assignee: International Business Machines Corporation, Armonk, N.Y.

[21] Appl. No.: 205,138

[22] Filed: Jun. 10, 1988

[51] Int. Cl.[4] .................... H04K 3/02; G06F 15/606
[52] U.S. Cl. ........................... 29/847; 29/850; 29/407; 364/489
[58] Field of Search ................ 29/825, 829, 846, 847, 29/850, 407; 364/488, 489, 490, 491; 437/8

[56] References Cited

U.S. PATENT DOCUMENTS

| | | | |
|---|---|---|---|
| 3,028,659 | 4/1962 | Chow et al. | 29/847 X |
| 3,378,920 | 4/1968 | Core | 29/847 |
| 3,384,879 | 5/1968 | Stahl et al. | 29/847 X |
| 4,613,941 | 9/1986 | Smith | 364/490 |
| 4,631,100 | 12/1986 | Pellegrino | 29/847 X |
| 4,713,773 | 12/1987 | Cooper et al. | 364/493 |
| 4,742,471 | 5/1988 | Yoffa et al. | 364/491 |
| 4,752,887 | 6/1988 | Kuwahara | 364/491 |
| 4,786,613 | 11/1988 | Gould et al. | 437/8 |

Primary Examiner—Timothy V. Eley
Attorney, Agent, or Firm—Douglas W. Cameron

[57] ABSTRACT

A method for interconnecting nodes in each of a number of nets. This invention involves generating initial zones for all nets and determining cumulative demand for path spaces needed by these initial zones. The demand is then compared with the supply, and scores are determined for the paths of the initial zones. Redundant paths with the worst scores are then gradually deleted until there are no redundant paths. If however, demand for path spaces still exceeds supply, expanded zones are generated in areas where demand exceeds supply and redundant paths are gradually deleted until there are no redundant paths. The paths remaining after deletion from the expanded zones are then used to interconnect the nodes of the nets. The nodes are then interconnected using the remaining paths.

9 Claims, 52 Drawing Sheets

FIG.11 — ROW 11, COL. 8 (V-5, H-7)

FIG. 16  TOTAL WIRE SPACE AVAILABLE FOR HORIZONTAL LINES

0 OVERFLOWING CELLS,  TOTAL OVERFLOWING SCORE = 0

FIG. 19 VERTICAL OVERFLOWS AFTER TAKING AWAY PROCESS

235 OVERFLOWING CELLS, TOTAL OVERFLOWING SCORE = −692

PLUSHOOD = 19 / 4711

FIG. 20 HORIZONTAL OVERFLOWS AFTER TAKING AWAY PROCESS

68 OVERFLOWING CELLS, TOTAL OVERFLOWING SCORE = -192

FIG. 21A

FIG. 22 VERTICAL OVERFLOWS AFTER GENERATION OF EXPANDED ZONES

361 OVERFLOWING CELLS, TOTAL OVERFLOWING SCORE = -2233

FIG. 23 HORIZONTAL OVERFLOWS AFTER GENERATION OF EXPANDED ZONES

FIG. 26 VERTICAL OVERFLOWS AFTER TAKING AWAY FROM EXPANDED ZONES

FIG. 34 — HORIZONTAL OVERFLOWS AT END OF RUN

PLUSHOOD = 10 − 7547 − −40

27 OVERFLOWING CELLS, TOTAL OVERFLOWING SCORE = −40

```
ENTERED MINV

RAN GLOBAL MIN VIA REDUCTION     11/03/87
  VERT  HORIZ    TOTAL
  -4368 -28381   -32749           STARTING POSITION
   -692   -192    -884            22:16:20

FORMED SMALL VERTICAL BOXES. NEED 3 PASSES.  11/03/87
  VERT  HORIZ   TOTAL    VBIAS HBIAS
  -692   -192    -884      0     0   INITIAL POSITION
  -391   -198    -589               22:20:58              < RERUN. TAKE NXT LINE
  -394   -200    -594               22:39:46
  -279   -186    -465               22:53:16              < RERUN. TAKE NXT LINE
  -279   -186    -465               23:00:12
  -262   -188    -450               23:02:35              < RERUN. TAKE NXT LINE
  -263   -188    -451               23:04:38

FORMED SMALL HORIZONTAL BOXES. NEED 2 PASSES.  11/03/87
  VERT  HORIZ   TOTAL    VBIAS HBIAS
  -263   -188    -451      0     0   INITIAL POSITION
  -289    -95    -384               23:08:31              < RERUN. TAKE NXT LINE
  -275   -110    -385               23:12:12
  -272   -101    -373               23:13:42

FORMED SMALL VERTICAL BOXES. NEED 4 PASSES.  11/03/87
  VERT  HORIZ   TOTAL    VBIAS HBIAS
  -272   -101    -373      0     0   INITIAL POSITION
  -234   -123    -357               23:27:55              < RERUN. TAKE NXT LINE
  -242   -106    -348               23:33:05
  -221   -112    -333               23:36:33              < RERUN. TAKE NXT LINE
  -218   -111    -329               23:39:57
  -215   -108    -323               23:41:38              < RERUN. TAKE NXT LINE
  -214   -106    -320               23:44:32
  -214   -107    -321               23:45:30              <= 0 BOXES. IGNORE.

FORMED SMALL HORIZONTAL BOXES. NEED 3 PASSES.  11/03/87
  VERT  HORIZ   TOTAL    VBIAS HBIAS
  -214   -106    -320      0     0   INITIAL POSITION
  -234    -83    -317               23:48:28              < RERUN. TAKE NXT LINE
  -217    -94    -311               23:50:17
  -227    -89    -316               23:52:33              < RERUN. TAKE NXT LINE
  -219    -89    -308               23:53:53              < RERUN. TAKE NXT LINE
  -219    -89    -308               23:54:56
  -218    -89    -307               23:55:42

FORMED SMALL VERTICAL BOXES. NEED 4 PASSES.  11/03/87
  VERT  HORIZ   TOTAL    VBIAS HBIAS
  -530   -214    -744     -1    -1   INITIAL POSITION
  -445   -271    -716           -1
  -194   -142    -336               00:11:03
  -386   -275    -661     -1    -1
  -166   -140    -306               00:18:41
  -375   -271    -646     -1    -1
  -161   -136    -297               00:20:20
  -372   -271    -643     -1    -1
  -159   -136    -295               00:21:09

FORMED SMALL HORIZONTAL BOXES. NEED 4 PASSES.  11/04/87
  VERT  HORIZ   TOTAL    VBIAS HBIAS
  -372   -271    -643     -1    -1   INITIAL POSITION
```

FORMED SMALL VERTICAL BOXES. NEED 3 PASSES.  11/04/87
```
VERT    HORIZ   TOTAL   VBIAS HBIAS
-415    -166    -581    -1    -1    INITIAL POSITION
-361    -194    -555    -1    -1
-162    -103    -265          00:47:10
-331    -200    -531    -1    -1
-137    -103    -240          00:54:43
-326    -202    -528    -1    -1
-134    -104    -238          00:56:33
```

FORMED SMALL HORIZONTAL BOXES. NEED 3 PASSES.  11/04/87
```
VERT    HORIZ   TOTAL   VBIAS HBIAS
-326    -202    -528    -1    -1    INITIAL POSITION
-377    -167    -544    -1    -1
-173    -83     -256          01:05:19                < RERUN. TAKE NXT LINE
-374    -170    -544    -1    -1
-169    -85     -254          01:11:45
-376    -151    -527    -1    -1
-170    -69     -239          01:15:26
-376    -150    -526    -1    -1
-169    -69     -238          01:16:55
```

FORMED SMALL VERTICAL BOXES. NEED 2 PASSES.  11/04/87
```
VERT    HORIZ   TOTAL   VBIAS HBIAS
-169    -69     -238    0     0     INITIAL POSITION
-123    -87     -210          01:23:00                < RERUN. TAKE NXT LINE
-144    -73     -217          01:26:57                < RERUN. TAKE NXT LINE
-143    -72     -215          01:29:13
-125    -76     -201          01:31:17                < RERUN. TAKE NXT LINE
-125    -75     -200          01:33:29
```

FORMED SMALL HORIZONTAL BOXES. NEED 2 PASSES.  11/04/87
```
VERT    HORIZ   TOTAL   VBIAS HBIAS
-125    -75     -200    0     0     INITIAL POSITION
-131    -62     -193          01:36:10                < RERUN. TAKE NXT LINE
-122    -63     -185          01:38:32                < RERUN. TAKE NXT LINE
-124    -63     -187          01:39:59
-124    -62     -186          01:41:01                < RERUN. TAKE NXT LINE
-124    -62     -186          01:41:56
```

FORMED SMALL VERTICAL BOXES. NEED 3 PASSES.  11/04/87
```
VERT    HORIZ   TOTAL   VBIAS HBIAS
-124    -62     -186    0     0     INITIAL POSITION
-113    -82     -195          01:45:08
-117    -63     -180          01:46:37                < RERUN. TAKE NXT LINE
-108    -66     -174          01:48:14
-113    -62     -175          01:49:19                < RERUN. TAKE NXT LINE
-113    -62     -175          01:50:14                <= 0 BOXES. IGNORE.
```

FORMED SMALL HORIZONTAL BOXES. NEED 2 PASSES.  11/04/87
```
VERT    HORIZ   TOTAL   VBIAS HBIAS
-113    -62     -175    0     0     INITIAL POSITION
```

FIG. 40

```
   -122    -60   -182       01:53:11        < RERUN. TAKE NXT LINE
   -117    -59   -176       01:54:16        < RERUN. TAKE NXT LINE
   -112    -62   -174       01:55:09
   -113    -62   -175       01:56:17        <= 0 BOXES. IGNORE.

FORMED SMALL VERTICAL BOXES.  NEED 4 PASSES.   11/04/87
  VERT  HORIZ  TOTAL    VBIAS HBIAS
  -745   -357  -1102      -2    -2   INITIAL POSITION
  -751   -395  -1146      -2    -2
  -168   -108   -276                 02:11:14
  -744   -411  -1155      -2    -2
  -212   -130   -342                 02:21:53
  -733   -420  -1153      -2    -2
  -213   -133   -346                 02:25:44
  -728   -417  -1145      -2    -2
  -208   -133   -341                 02:27:07

FORMED SMALL HORIZONTAL BOXES.  NEED 4 PASSES.   11/04/87
  VERT  HORIZ  TOTAL    VBIAS HBIAS
  -728   -417  -1145      -2    -2   INITIAL POSITION
  -733   -338  -1071      -2    -2
  -207    -88   -295                 02:34:16
  -749   -305  -1054      -2    -2
  -214    -70   -284                 02:37:49
  -766   -279  -1045      -2    -2
  -230    -54   -284                 02:40:03
  -766   -280  -1046      -2    -2
  -229    -55   -284                 02:40:56

FORMED SMALL VERTICAL BOXES.  NEED 3 PASSES.   11/04/87
  VERT  HORIZ  TOTAL    VBIAS HBIAS
  -766   -279  -1045      -2    -2   INITIAL POSITION
  -678   -310   -988      -2    -2
  -171    -72   -243                 02:52:02
  -658   -332   -990      -2    -2
  -148    -87   -235                 02:58:02
  -629   -335   -964      -2    -2
  -132    -89   -221                 03:01:04

FORMED SMALL HORIZONTAL BOXES.  NEED 4 PASSES.   11/04/87
  VERT  HORIZ  TOTAL    VBIAS HBIAS
  -629   -335   -964      -2    -2   INITIAL POSITION
  -660   -281   -941      -2    -2
  -159    -58   -217                 03:07:25
  -660   -263   -923      -2    -2
  -162    -48   -210                 03:10:28
  -658   -258   -916      -2    -2
  -160    -48   -208                 03:12:02

FORMED SMALL VERTICAL BOXES.  NEED 3 PASSES.   11/04/87
  VERT  HORIZ  TOTAL    VBIAS HBIAS
  -160    -48   -208       0     0   INITIAL POSITION
  -105    -55   -160                 03:16:22        < RERUN. TAKE NXT LINE
  -107    -53   -160                 03:19:22
   -93    -55   -148                 03:21:07        < RERUN. TAKE NXT LINE
   -92    -56   -148                 03:23:00
   -89    -56   -145                 03:24:02

FORMED SMALL HORIZONTAL BOXES.  NEED 2 PASSES.   11/04/87
  VERT  HORIZ  TOTAL    VBIAS HBIAS
   -89    -56   -145       0     0   INITIAL POSITION
```

FIG. 41

```
   -100   -42   -142      03:26:07         < RERUN. TAKE NXT LINE
    -91   -49   -140      03:27:41         < RERUN. TAKE NXT LINE
    -91   -49   -140      03:29:06
    -93   -42   -135      03:30:14         < RERUN. TAKE NXT LINE
    -94   -41   -135      03:31:18

FORMED SMALL VERTICAL BOXES.  NEED  3 PASSES.   11/04/87
   VERT  HORIZ  TOTAL    VBIAS HBIAS
    -94   -41   -135       0     0    INITIAL POSITION
    -74   -48   -122             03:34:21         < RERUN. TAKE NXT LINE
    -79   -40   -119             03:36:04
    -73   -44   -117             03:37:25         < RERUN. TAKE NXT LINE
    -76   -40   -116             03:38:35
    -76   -40   -116             03:39:43         <= 0 BOXES. IGNORE.

FORMED SMALL HORIZONTAL BOXES. NEED  2 PASSES.   11/04/87
   VERT  HORIZ  TOTAL    VBIAS HBIAS
    -76   -40   -116       0     0    INITIAL POSITION
    -86   -32   -118             03:41:57         < RERUN. TAKE NXT LINE
    -77   -37   -114             03:43:16
    -77   -37   -114             03:44:15         <= 0 BOXES. IGNORE.

FORMED LARGE VERTICAL BOXES.  NEED  4 PASSES.   11/04/87
   VERT  HORIZ  TOTAL    VBIAS HBIAS
    -77   -37   -114       0     0    INITIAL POSITION
    -78   -58   -136             03:47:35         < RERUN. TAKE NXT LINE
    -75   -40   -115             03:48:53         < RERUN. TAKE NXT LINE
    -75   -39   -114             03:50:48
    -85   -52   -137             03:52:48         < RERUN. TAKE NXT LINE
    -74   -41   -115             03:54:00         < RERUN. TAKE NXT LINE
    -77   -40   -117             03:55:10         < RERUN. TAKE NXT LINE
    -76   -40   -116             03:56:18
    -74   -40   -114             03:57:30         < RERUN. TAKE NXT LINE
    -76   -38   -114             03:58:52         < RERUN. TAKE NXT LINE
    -73   -40   -113             03:59:55
    -71   -42   -113             04:01:00         <= 0 BOXES. IGNORE.

FORMED LARGE HORIZONTAL BOXES. NEED  2 PASSES.   11/04/87
   VERT  HORIZ  TOTAL    VBIAS HBIAS
    -73   -40   -113       0     0    INITIAL POSITION
   -100   -47   -147             04:04:02         < RERUN. TAKE NXT LINE
    -73   -39   -112             04:04:53
    -73   -39   -112             04:05:58         < RERUN. TAKE NXT LINE
    -72   -40   -112             04:06:51

MOVED SEGS CUT BY TWO PAR LINES      11/04/87
   VERT  HORIZ  TOTAL
    -72   -40   -112            STARTING POSITION
    -63   -40   -103            04:07:10
    -63   -36    -99            04:07:14

MOVED  L AND T  SEGMENTS           11/04/87
   VERT  HORIZ  TOTAL
    -63   -36    -99            STARTING POSITION
    -39   -37    -76            04:08:08
    -43   -19    -62            04:08:28

FORMED SMALL VERTICAL BOXES.  NEED  2 PASSES.   11/04/87
   VERT  HORIZ  TOTAL    VBIAS HBIAS
    -43   -19    -62       0     0    INITIAL POSITION
    -43   -27    -70             04:11:06         < RERUN. TAKE NXT LINE
```

FIG. 42

```
    -36    -23    -59        04:12:20
    -35    -23    -58        04:13:14              < RERUN. TAKE NXT LINE
    -35    -23    -58        04:14:30

FORMED SMALL HORIZONTAL BOXES. NEED 2 PASSES.  11/04/87
   VERT   HORIZ  TOTAL    VBIAS HBIAS
    -35    -23    -58       0     0    INITIAL POSITION
    -39    -20    -59                  04:16:11              < RERUN. TAKE NXT LINE
    -36    -20    -56                  04:17:31
    -36    -17    -53                  04:18:33              < RERUN. TAKE NXT LINE
    -36    -17    -53                  04:19:31

MOVED  L AND T  SEGMENTS         11/04/87
   VERT   HORIZ   TOTAL
    -36    -17    -53        STARTING POSITION
    -30    -17    -47        04:20:22
    -32    -13    -45        04:20:38

MOVED ELBOW FORMING SEGMENTS     11/04/87
   VERT   HORIZ   TOTAL
    -32    -13    -45        STARTING POSITION
    -17    -11    -28        04:21:06
    -17     -8    -25        04:21:06

MOVED ELBOW FORMING SEGMENTS     11/04/87
   VERT   HORIZ   TOTAL
    -17     -8    -25        STARTING POSITION
    -15     -8    -23        04:21:29
    -15     -8    -23        04:21:30

MOVED ELBOW FORMING SEGMENTS     11/04/87
   VERT   HORIZ   TOTAL
    -15     -8    -23        STARTING POSITION
    -14     -8    -22        04:21:48
    -14     -8    -22        04:21:48

MOVED SEGS CUT BY TWO PAR LINES   11/04/87
   VERT   HORIZ   TOTAL
    -14     -8    -22        STARTING POSITION
    -12     -8    -20        04:22:12
    -12     -8    -20        04:22:12

MOVED  L AND T  SEGMENTS         11/04/87
   VERT   HORIZ   TOTAL
    -12     -8    -20        STARTING POSITION
    -11     -8    -19        04:22:41
    -11     -8    -19        04:22:48

MOVED ELBOW FORMING SEGMENTS     11/04/87
   VERT   HORIZ   TOTAL
    -11     -8    -19        STARTING POSITION
     -9     -8    -17        04:23:20
     -8     -6    -14        04:23:20

MOVED  L AND T  SEGMENTS         11/04/87
   VERT   HORIZ   TOTAL
     -8     -6    -14        STARTING POSITION
     -1     -1             VBIAS,HBIAS
   -175   -104   -279        04:25:10
   -179    -78   -257        04:26:21
    -11     -8    -19        04:26:21
```

FIG. 43

```
MOVED   L AND T  SEGMENTS              11/15/87
   VERT    HORIZ    TOTAL
    -11      -8      -19               STARTING POSITION
     -1      -1                        VBIAS,HBIAS
   -164     -80     -244               23:19:11
   -164     -74     -238               23:20:12
     -8      -8      -16               23:20:12

MOVED ELBOW FORMING SEGMENTS           11/15/87
   VERT    HORIZ    TOTAL
     -8      -8      -16               STARTING POSITION
     -1      -1                        VBIAS,HBIAS
   -124     -65     -189               23:20:48
   -122     -56     -178               23:20:54
     -3      -5       -8               23:20:54

MOVED ELBOW FORMING SEGMENTS           11/15/87
   VERT    HORIZ    TOTAL
     -3      -5       -8               STARTING POSITION
     -1      -1                        VBIAS,HBIAS
   -116     -56     -172               23:21:25
   -116     -53     -169               23:21:28
     -3      -5       -8               23:21:28

MOVED SEGS CUT BY TWO PAR LINES        11/15/87
   VERT    HORIZ    TOTAL
     -3      -5       -8               STARTING POSITION
     -1      -1                        VBIAS,HBIAS
   -113     -36     -149               23:21:52
   -113     -33     -146               23:21:55
     -4      -4       -8               23:21:55

MOVED   L AND T  SEGMENTS              11/15/87
   VERT    HORIZ    TOTAL
     -4      -6      -10               STARTING POSITION
     -2      -6       -8               23:22:14
     -2      -4       -6               23:22:18

MOVED   L AND T  SEGMENTS              11/15/87
   VERT    HORIZ    TOTAL
     -2      -4       -6               STARTING POSITION
     -2      -4       -6               23:22:44
     -2      -2       -4               23:22:48

MOVED ELBOW FORMING SEGMENTS           11/15/87
   VERT    HORIZ    TOTAL
     -2      -2       -4               STARTING POSITION
     -1      -2       -3               23:23:09
     -1      -1       -2               23:23:09

MOVED SEGS CUT BY TWO PAR LINES        11/15/87
   VERT    HORIZ    TOTAL
     -1      -1       -2               STARTING POSITION
     -2      -2                        VBIAS,HBIAS
   -512    -241     -753               23:23:56
   -512    -230     -742               23:24:06
     -1      -1       -2               23:24:06

MOVED   L AND T  SEGMENTS              11/15/87
   VERT    HORIZ    TOTAL
     -1      -1       -2               STARTING POSITION
```

FIG. 44

```
       -2     -2                    VBIAS,HBIAS
     -467   -235       -702         23:26:15
     -474   -203       -677         23:27:52
       -1     -3         -4         23:27:52

MOVED ELBOW FORMING SEGMENTS        11/15/87
  VERT   HORIZ       TOTAL
    -1     -3          -4           STARTING POSITION
    -2     -2                       VBIAS,HBIAS
  -423   -185        -608           23:28:32
  -420   -170        -590           23:28:43
    -1     -2          -3           23:28:43

MOVED ELBOW FORMING SEGMENTS        11/15/87
  VERT   HORIZ       TOTAL
    -1     -2          -3           STARTING POSITION
     0     -2          -2           23:28:58
     0      0           0           23:28:58
```

NET = 3409

GLOBAL WIRING BY REMOVAL OF REDUNDANT PATHS

DESCRIPTION

1. Technical Field

This invention describes a method of interconnecting nodes on a chip, or more generally nodes of any device. More specifically, this invention involves generating initial zones for nets whose nodes are to be interconnected. An initial zone is a subset of the total paths for interconnecting the nodes of a net, and contains redundant paths when more than one minimum length path can be used to connect any two nodes of the net. Redundant paths having the worst scores, which are a function of a comparison of supply and demand for path spaces, are then gradually deleted until there are no redundant paths.

2. Description of the Prior Art

Global wiring, which plays a very important part in the physical design of a circuit chip, generates an approximate routing for a network of wires without specifying specific tracks (see below). This wiring is then followed by the more detailed assignment of tracks. This two step process is also applicable to cards, boards and other packages.

Many global wiring programs can be described as "segment movers" in the algorithms they employ for net reconfiguration. To reroute a net, they first identify one particular segment (a straight section of wire running along a "column" or "row") as the one to be moved. Typically on chips, wire traffic may be routed vertically on one or more planes and horizontally on other planes. The term "column" specifies a collection of parallel wire channels in the vertical direction, while a "row" specifies a collection of parallel wire channels in the horizontal direction. So, after a segment has been identified for potential movement, this segment is relocated to another parallel column or row, and then other pieces of wire are adjusted to reconnect the moved segment to the rest of the net. Finally, the new configuration is compared to the old and just one configuration is kept. The dependent adjustments of connecting wires can be handled in a relatively simplistic manner. This helps keep the computation time down, but can lead to excessive wire lengths and non-optimal solutions.

Global routing algorithms which move wire segments to find better routes must try many moves which are unsuccessful. Several segments might be considered for relocation to several different locations on just one review of one net, so the amount of computation can become quite large. Early in the process it may not be too difficult to find a satisfactory relocation of a segment.

However, near the end of the process on a design which has relatively little "extra" wiring space, it becomes extremely difficult to discover winning moves. Segment moving programs must try many moves which have worse scores (see below) before finally finding a move which has an acceptable score. These programs find solutions for easy designs quickly, but for difficult designs the amount of computation time can be considerable.

One such segment mover is described in a paper entitled, "Wire Routing by Optimizing Channel Assignment within Large Apertures", by Akihiro Hashimoto and James Stevens, pp. 155–169 of Proceedings of the Eighth Design Automation Workshop, 1971. Hashimoto and Stevens defined "spaces" containing several parallel "channels", where each channel could hold just one wire. They initially routed each net optimally through the centers of the spaces, ignoring congestion due to other nets (see below). Then they moved segments from spaces which were overcrowded to nearby spaces which were not overcrowded, until all problem areas were eliminated.

Another common approach to global routing is by maze-runner methods. Maze-runner algorithms have been widely used for routing problems at least since the publication of "An Algorithm for Path Connections and Its Applications" by C. Y. Lee in IRE Transactions on Electronic Computers, September 1961, pp. 346–365. "Cellular Wiring and Cellular Modeling Technique" by R. Hitchcock, pp 25–41 of Proceedings of the Sixth Design Automation Workshop, another maze-running technique describes maze-running in an array of octagonal cells, with each cell able to contain several wires. "A Router for Multilayer Printed Wiring Backplanes" by J. C. Foster in Proceedings of the Tenth Design Automation Workshop, pp. 44–48, 1973, describes a maze-runner which routes through channels of several tracks each, constrains wiring to a single direction on each plane, and makes sure both vias (see below) and tracks are available for each connection. Many other variations of maze-runners for global wiring have been developed, such as the "loose router" described by J. Soukup and J. C. Royle in "On Hierarchical Routing", Journal of Digital Systems, Vol. 5, No. 3, September 1981.

Global wiring programs which use a maze-runner algorithm as their principal routing method have many problems. Foremost is the difficulty of routing nets with many pins. The basic maze-runner only operates with two-point connections. Nets of more than two pins must be broken into several connections, but there is no way to find the best decomposition of a net before the routing is started. A second difficulty is the exhaustive search for solutions, which is often considered one of the strengths of the maze-runner. Exhaustive search consumes considerable time, especially when the points to be connected are widely separated. Many maze-runner variations have been introduced just to conserve computation time and storage space. In addition, it is easy for this algorithm to introduce meandering routes with many vias and added wire lengths. These meandering routes may appear to improve congestion scores early in the run, but unless they are carefully controlled they can lead to difficulties at the end of the run. A third difficulty is the additive nature of most maze-runners. That is, the first connection to be routed has no congestion to contend with, since no other connections have been routed. As more connections are routed, congestion increases and becomes a significant factor in routing additional nets. The last connections to be routed often have overwhelming congestion problems to contend with, which makes successful completion nearly impossible on difficult designs. This additive process favors the first connections, at the expense of the last connections, but there is no way to order connections to make sure they all can be routed. With just one algorithm for creating initial routings of nets, and for rerouting nets (if the maze-runner programs do this), the maze-runner programs are limited. Varying the procedures and scoring parameters during the run can reduce this limitation, but it cannot be entirely overcome.

A global wiring program for chips was developed by a team in IBM Burlington, Vermont. This program is described in IBM Technical Report TR 19.0522, "Burlington's Global Wiring Program", by J. B. Hickson, Jr., P. H. Bergeron, and J. W. Thorvaldson, September 1981. An overview of that chip physical design system, including a summary of the global wiring process, was published as "A System for Automatic Layout of Gate Array Chips", by K. W. Lallier, J. B. Hickson, Jr., and R. K. Jackson, pp. 54–58, in Proceedings of the European Conference on Electronic Design Automation, September 1981. The program developed in Burlington is based upon the "segment mover" concepts outlined above. A Multichip LSI Routing Program COMPAS", by Yoshi Sugiyama, Kazuhiro Ueda, Kenji Kani, and Masanori Teramoto, of Nippon Electric, in Review of the Electrical Communication Laboratories Volume 25, Numbers 5-6, May–June 1977, pp. 445-454, describes another global wiring program. In addition to congestion, this considers length constraints due to electrical characteristics when rerouting nets. Nets to be rerouted may be selected either from those which pass through crowded channels, or from long nets.

To reroute a net after all nets are routed, one must necessarily disturb the structure of the wiring. As rerouting continues, the amount of wire allocated to areas more closely matches the amounts of wiring space available. The wires of all the nets fit together in a structure which acquires a progressively more "finished", "smooth", and "perfected" quality. Part of this structure will be due to "accidents", and part will be due to features of the particular design. If the structure is disturbed, or if the program is rerun with slightly different conditions, those structural aspects which are accidental will probably turn out quite different, while those which are inherent in the particular design will probably turn out about the same. The more perfect the structure, the greater the resistance to change until finally a "traffic jam" or total stoppage by the existing mode of evaluating net moves will occur, no single move being available.

All global wiring procedures must include features which help overcome this resistance, so they can converge to adequate solutions. These are sometimes called "traffic jam" mechanisms. (See "Design by Natural Selection", B. Dunham, D. Fridshal, R. Fridshal and J. H. North, IBM Research Report RC-476, 1961.) At early stages of net rerouting in global wiring, it is imperative to keep breaking up the structures which are accidentally formed so that the structures necessary for solution of the particular problem are allowed to find their best forms. Traffic jam mechanisms appropriate for these early stages are comparable to shaking a sieve full of peas to keep keep them falling through the holes.

Within IBM, several global wiring programs have been written. "The Chip Layout Problem: An Automatic Wiring Procedure", by K. A. Chen, M. Feuer, K. H. Khokhani, N. Nan and S. Schmidt, in Proceedings of the Fourteenth Design Automation Conference, pp. 298-302, 1977, includes a description of global wiring, and states that this automatic wiring program was completed in 1972. A more detailed description of this program is contained in "Wirability Analysis Program II (WAP II): Basic Algorithm and User's Guide" by Kuo An Chen, IBM Technical Report TR 22.1796, dated July 22, 1974. In the latter report, Chen said that earlier versions of the program moved wires, but his new algorithm does not. Chen does initial routings of all nets, ignoring congestion, with a "Steiner Tree" approach. The net reconfiguration defines a rectangle enclosing points to be connected, inserts wires spanning the rectangle both vertically and horizontally through all the points to be connected, and then removes the most costly portions of loops until just essential portions remain. These differences between the Chen method and the current invention are all advantageous to the current invention, so that much more difficult wire routing problems can be solved using the approach presented in this invention. (1) In his initial routing of individual nets, Chen does not present initial zone configurations as we have described them, maximizing future choice opportunity for the taking away process. (2) There is no overlaying of initial zone configurations, and therefore no gradualistic taking away segment by segment. (3) The box approach for isolating trouble spots and eliminating overflows is not part of his approach. The effect of these differences is that the Chen method makes choices prematurely and in an arbitrary manner, thereby building in a degree of undesirable structure difficult to resolve. The absence of the box approach (which introduces new choice opportunity for a maximum degree in a troublesome area) means that only a very limited readjustment of original arbitrary built in structure can be achieved.

SUMMARY OF THE INVENTION

This invention describes a method for interconnecting nodes of a number of nets. This method comprises generating an initial zone for each of the nets. The initial zone can be any set of paths used for interconnecting the nodes of each net, but this initial zone contains redundant paths when more than one minimum length path can be used to interconnect any two nodes of any given net. The next step of this method is to determine the cumulative demand for path spaces created by the initial zones above. Next, a net is selected from the above, and a number of redundant paths is selected from the selected net. Then, the cumulative demand found above is compared with the supply of available path spaces in an area used by the redundant paths selected above. Then, a score is determined with the score being a function of at least the above comparison. Then, a redundant path is deleted from the initial zone for the net selected above, and this redundant path is the one with the worst score of any of the above selected paths. This process is then repeated with the selection of other nets and paths until all redundant paths are deleted from the initial zone for each net. The cumulative demand is recalculated each time this process is repeated without including paths which were deleted in prior repetitions of this process. Finally, the nodes of each net are interconnected using the paths that were not deleted above if path spaces are available.

However, if all redundant paths have been removed using the process described in the above paragraph, and if the demand for path spaces still exceeds the supply, one uses the method described below. First an area where demand for path spaces exceeds supply is selected. Next, expanded zones are generated for each sub-net. The sub-net refers to that part of a net within the selected area and includes nodes formed as points at the intersection of remaining paths and the perimeter of the selected area. The term remaining paths refers to paths remaining after deletion of redundant paths as described in the above paragraph. An expanded zone is any set of paths used to interconnect nodes of each sub-net and includes redundant paths. Next, the cumulative demand for path spaces needed in the selected area for expanded zones is determined. Then, a sub-net is selected in the selected area. Next, a number of redundant paths of the expanded zone for the selected sub-net are selected. Then, the demand for path spaces is compared with the supply of available path spaces in the selected area. Then, a score for each of the redundant paths selected above is determined. This score is a function of at least the comparison described above. Next, a path is deleted from the selected redundant paths, and this path is the one with the worst score as determined above. This process is then repeated until each of the expanded zones in the area has no redundant paths. It must be remembered that the cumulative demand for path spaces is recalculated for each repetition of this process when a path is deleted. Next, the above process is repeated for other selected areas where demand for wire spaces exceeds supply. Finally, the nodes of each net are interconnected with undeleted paths if path spaces are available for the undeleted paths remaining.

BRIEF DESCRIPTION OF THE DRAWINGS

FIG. 3A is a schematic representation of a sample net and its initial zone, while

FIG. 11 is a schematic illustration of a cell having a vertical overflow of 5 and a horizontal overflow of 7.

FIG. 16 is a schematic illustration of the wire spaces available in the horizontal rows of the chip.

Figure 17:
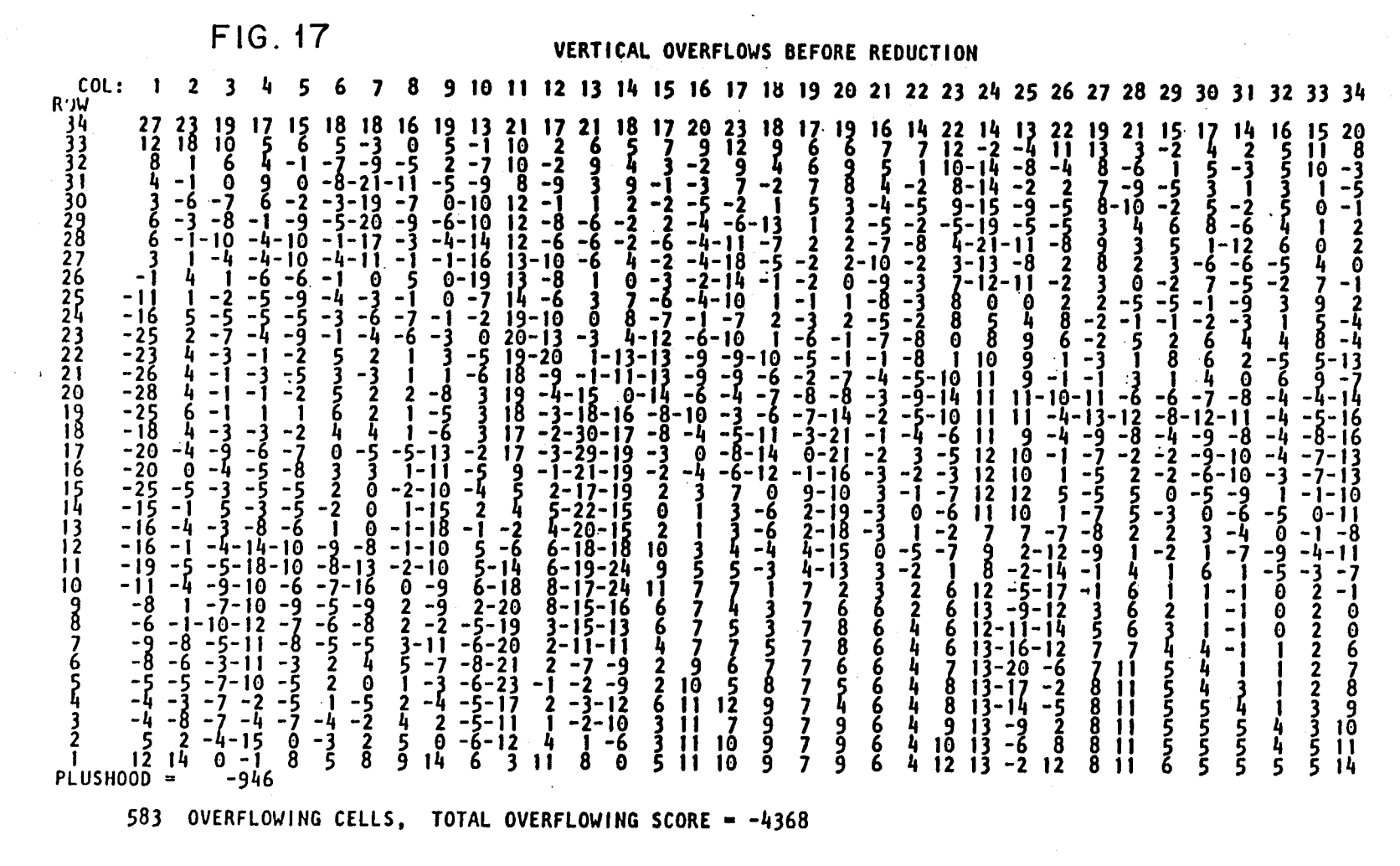

FIG. 17 shows the vertical overflows resulting from the comparison of cumulative demand for wire spaces and the supply of available wire spaces.

Figure 18:
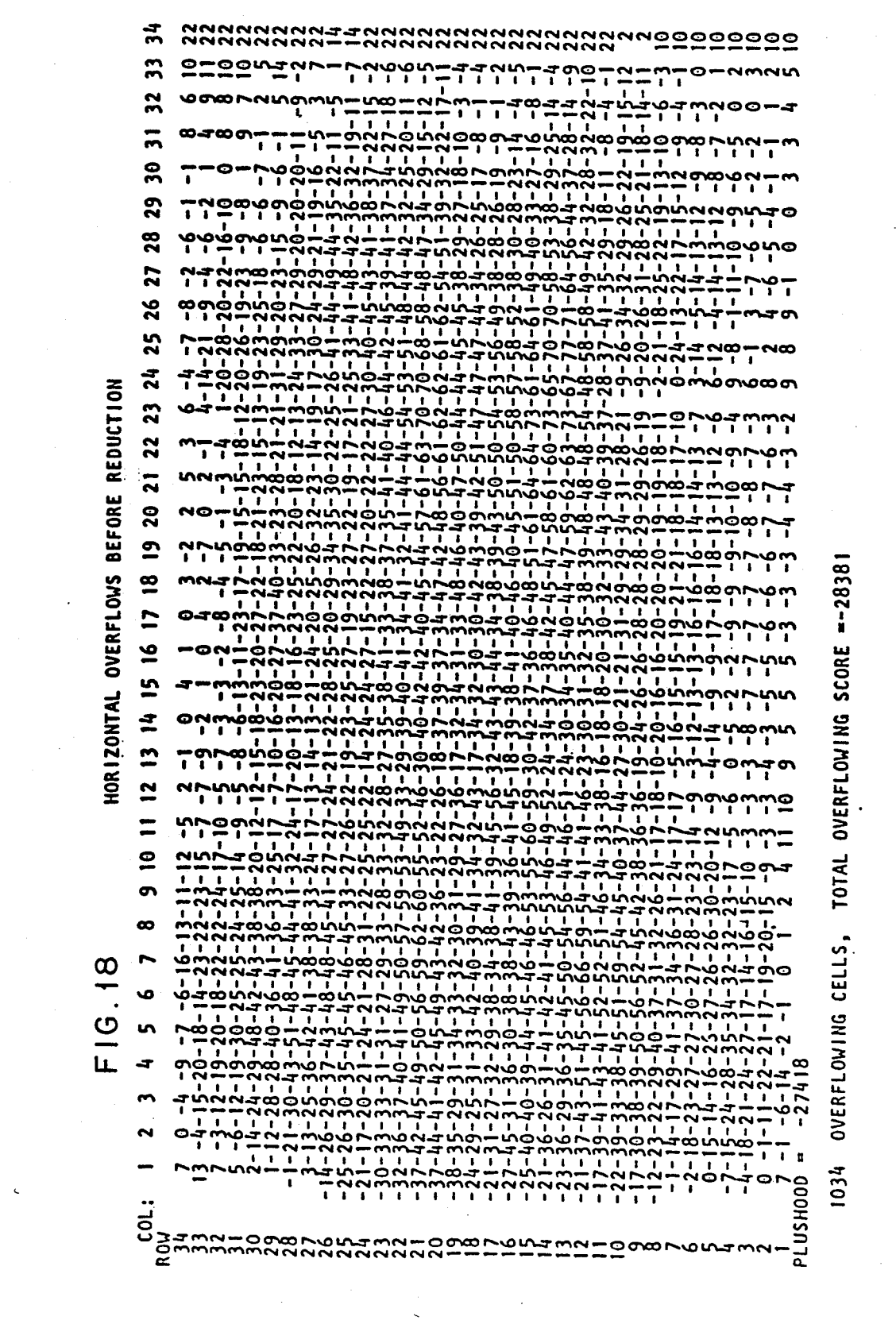

FIG. 18 shows the horizontal overflows resulting from the comparison of cumulative demand for wire space and the supply of wire spaces.

FIG. 19 shows the vertical overflows after deleting redundant paths from the initial zones.

FIG. 20 shows the horizontal overflows after deleting redundant paths from the initial zones.

FIG. 22 shows the vertical overflows created by the generation of expanded zones. These overflows result from the comparison of cumulative demand for wire spaces and the supply of available wire spaces.

FIG. 23 shows the horizontal overflows resulting from the generation of the expanded zones and from comparing the cumulative demand for wire spaces and the availability of wire spaces.

FIG. 24 shows the vertical overflows after deleting redundant paths from the expanded zones.

FIG. 25 shows the horizontal overflows after deleting redundant paths from the expanded zones.

Figure 27:
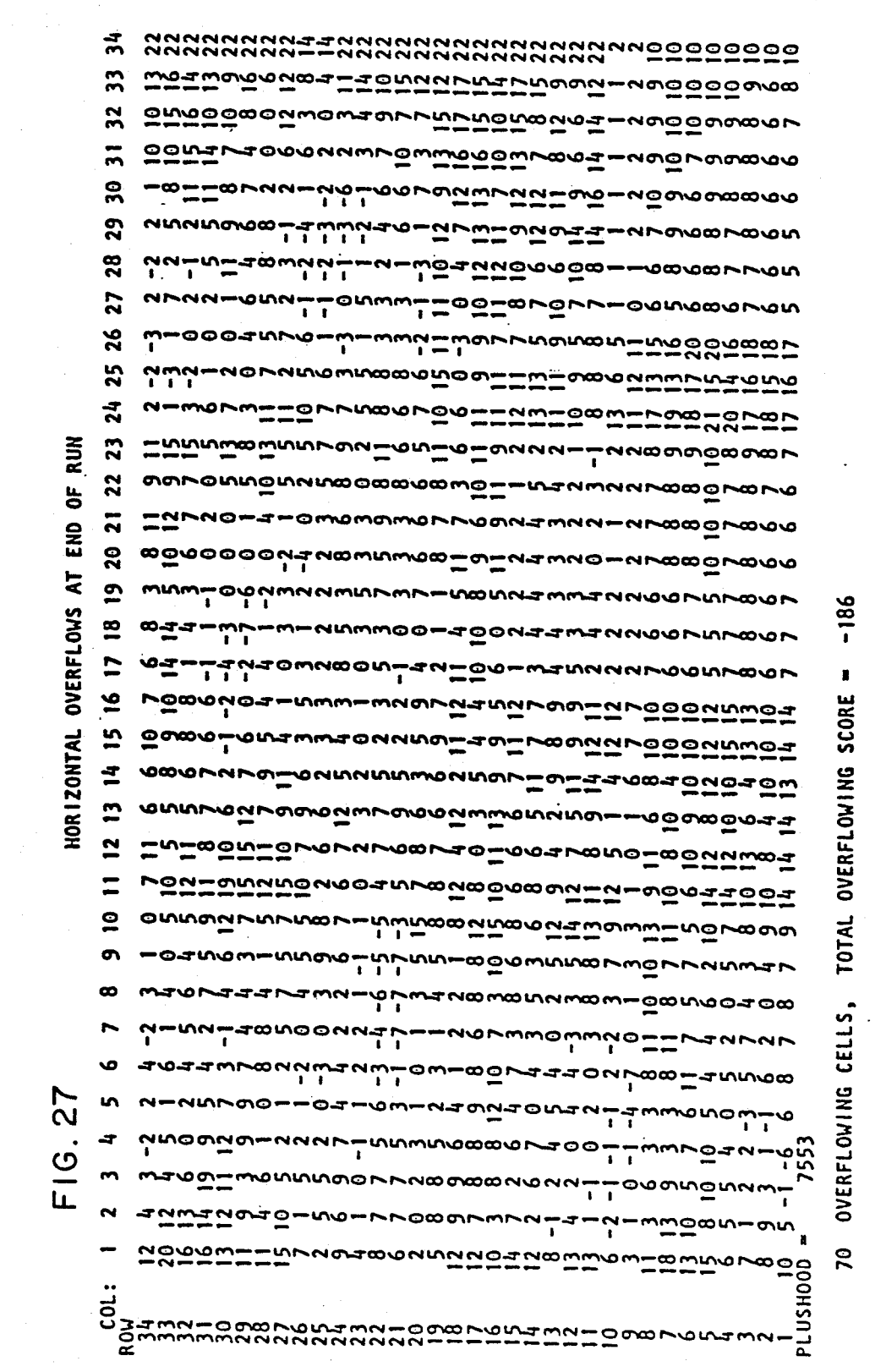

FIGS. 26 and 27 show vertical and horizontal overflows respectively resulting from the deletion of redundant paths from expanded zones at a later point in the solution of the problem.

Figure 29:
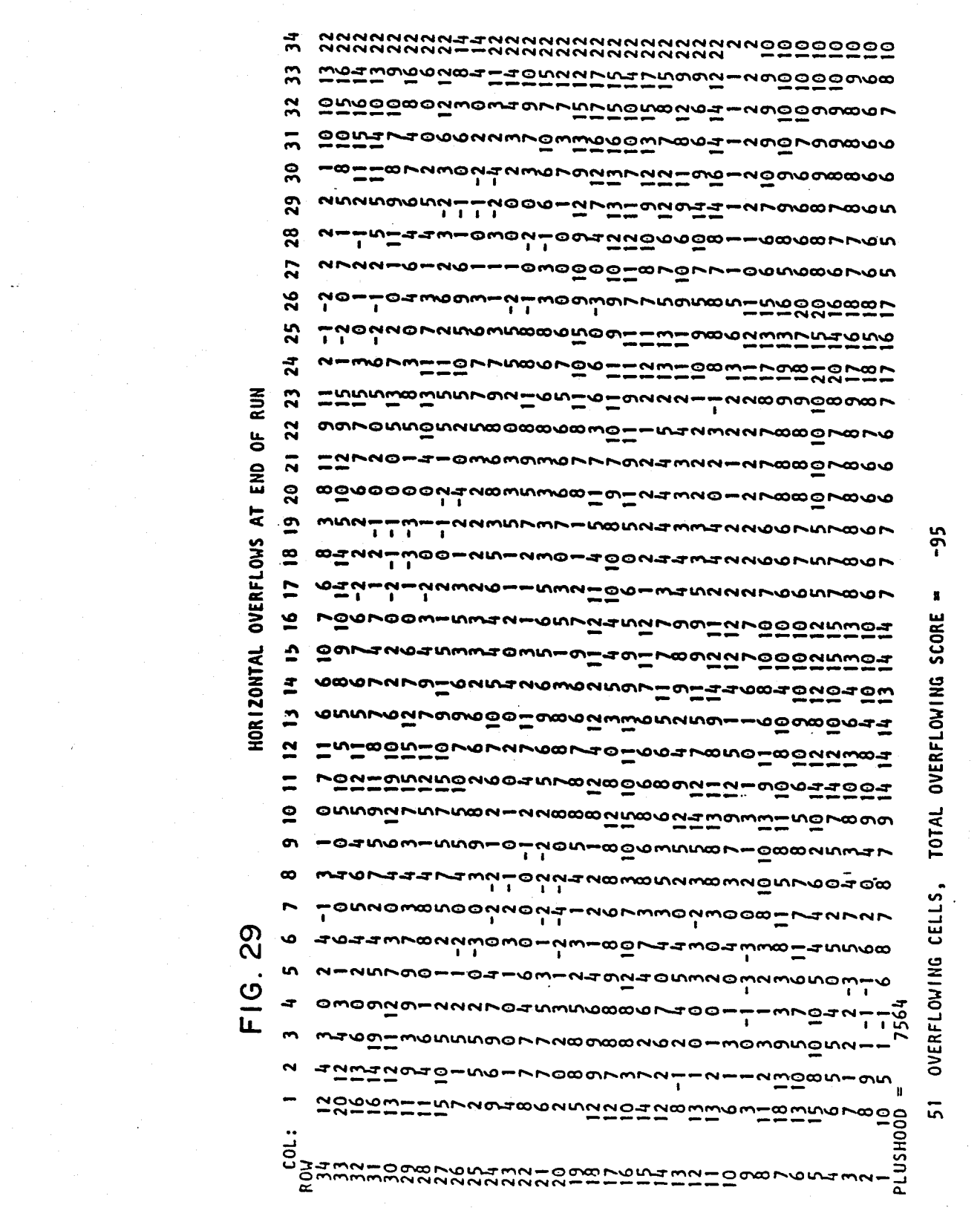

FIGS. 28 and 29 show vertical and horizontal overflows resulting from the deletion of redundant paths from expanded zones at a later point in the solution of the problem.

Figure 31:
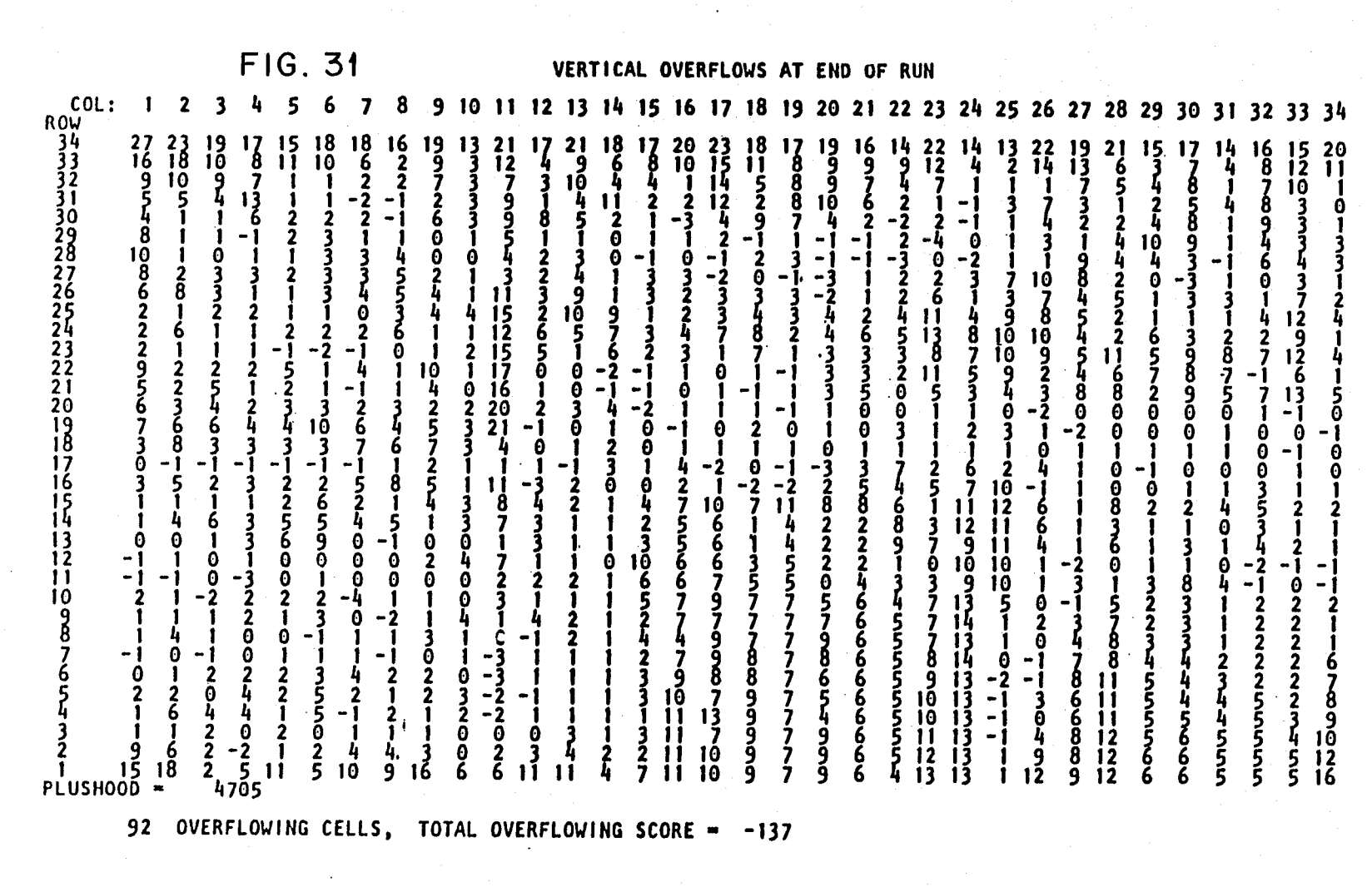
Figure 32:
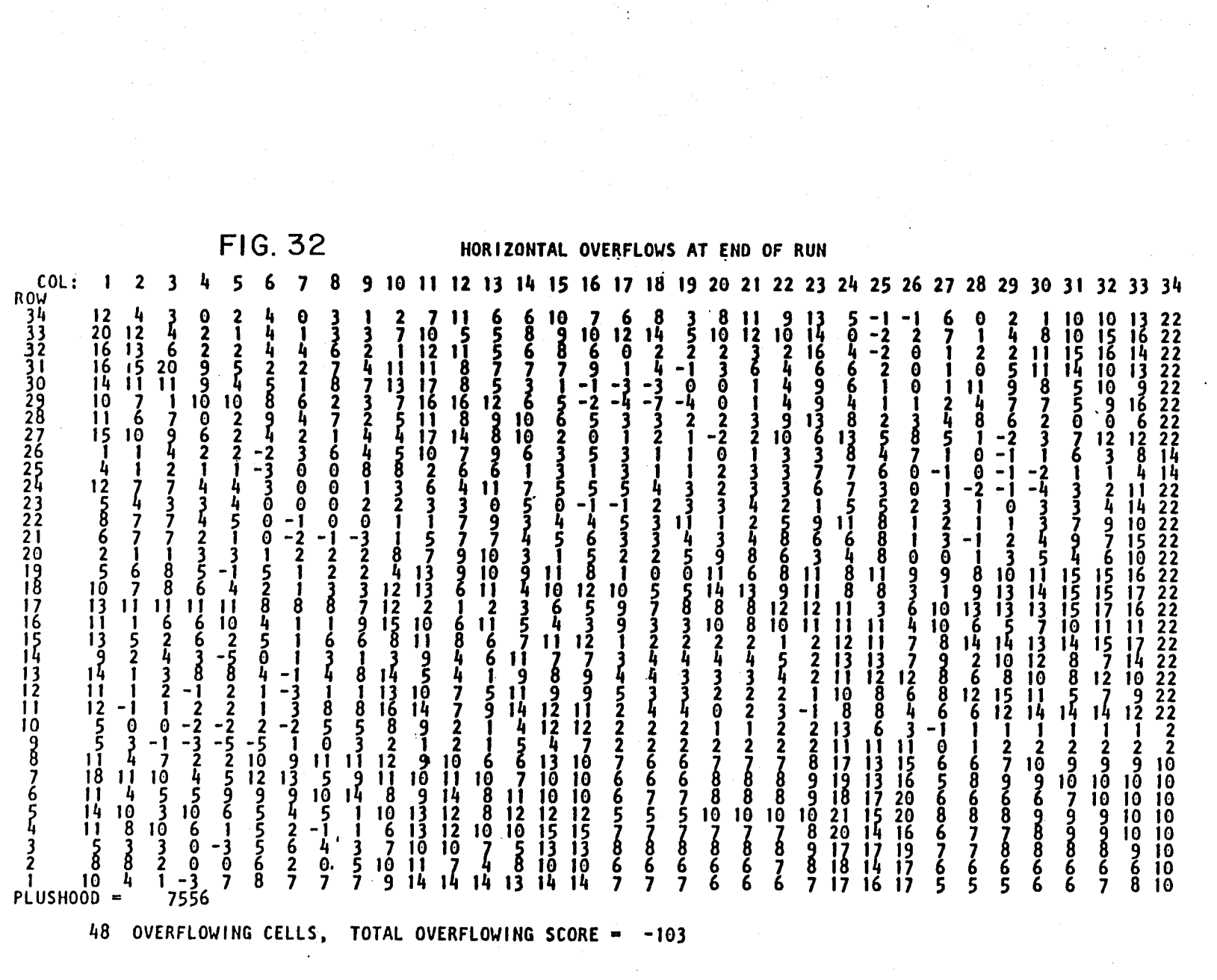

FIGS. 31 and 32 show vertical and horizontal overflows respectively after bias runs of -1 or -2 followed by a new bias run.

FIGS. 33 and 34 show vertical and horizontal overflows obtained after several repetitions of the method of this invention.

FIG. 35 shows some areas where expanded zones were generated.

FIGS. 36 and 37 show respectively vertical and horizontal overflows reached after deleting redundant paths from expanded zones.

Figure 39:
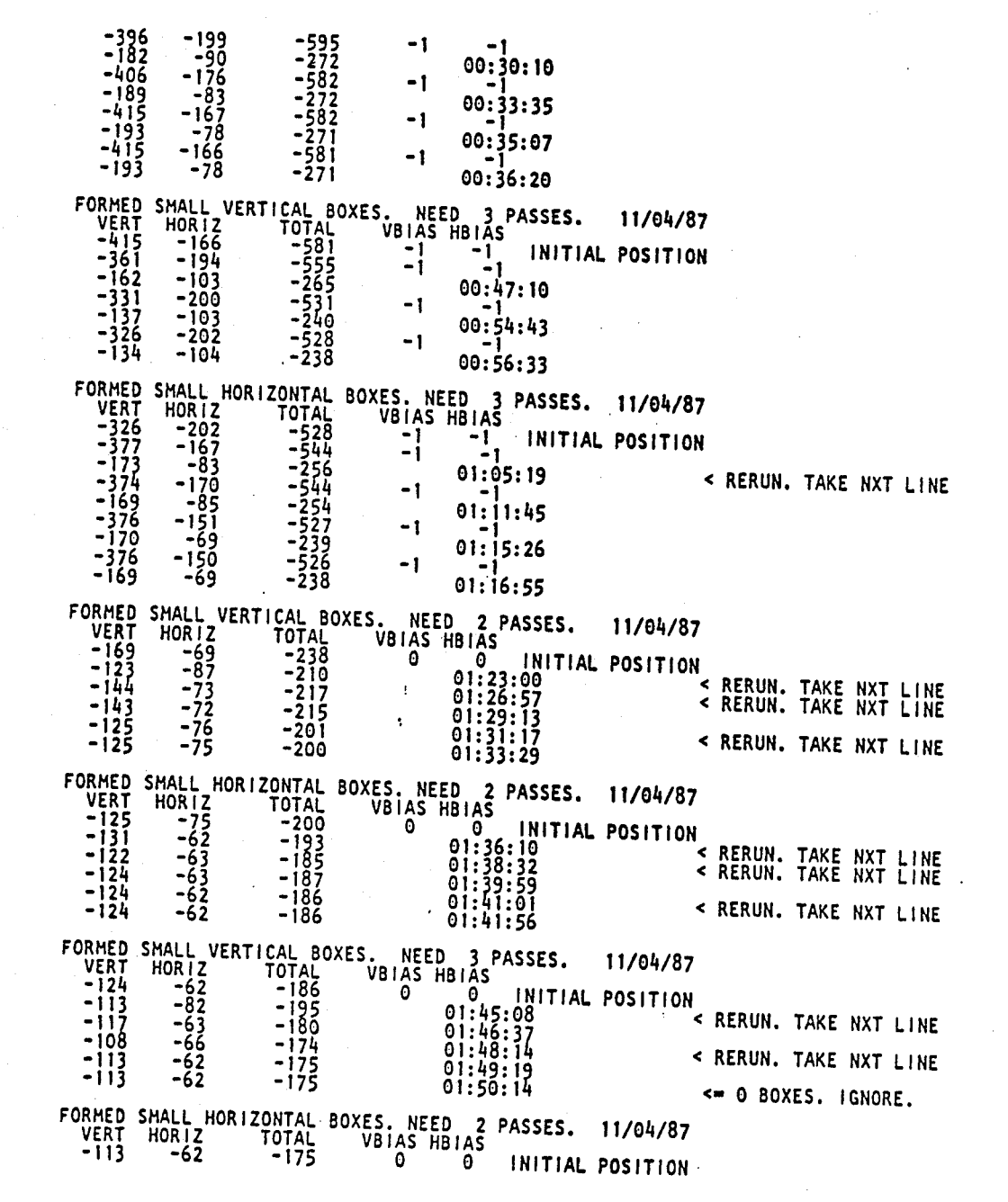

FIGS. 38 through 44 provide a summary of the results obtained from several iterations of the method of this invention.

FIGS. 45 and 46 show respectively that the vertical and horizontal overflows were indeed reduced to zero using the method of this invention.

FIG. 56 also shows the expanded zones in the selected area.

DESCRIPTION OF THE PREFERRED EMBODIMENT

In the logical design for a chip, card, or board; certain circuit nodes are required to be connected to one another by intermediate wires. A node of one circuit may be tied to a node of a second circuit, and also to a node of a third circuit. If we assume no other nodes connect to the three just cited, a three point "net" has been logically specified. Apart from performance requirements, the logical statement of a chip is to specify all the different occurrences of circuit types to be used, for example, 230 3-way OR's, 560 4-way AND's, and so forth. Each individual circuit is given a unique name or number, plus a detailed listing of all the specific node connections, that is, nets, required.

A physical design is a blueprint for a physical layout in which all of the basic circuits are precisely located (a process called "placement"), and in which all of the necessary net wiring connections are precisely located, a process called "wire routing". The "placement" and "wire routing" is all done in accordance with whatever so called "ground rules" apply to the technology in use.

For example, on a given wiring plane in a particular technology, the minimum distance between parallel wires is always specified.

Wire routing normally subdivides into a two stage process: (1) "global wire routing", and (2) "exact embedding." Global wire routing generates an approximate routing for all nets without specifying specific tracks or specific points of transit from one wiring plane to another. Exact embedding provides exact physical location for every wire and intermediate transit node.

The invention herein described is a new method for global wire routing which is, as can be seen, fundamental to almost all physical design of chips, cards, and boards.

Figure 1:
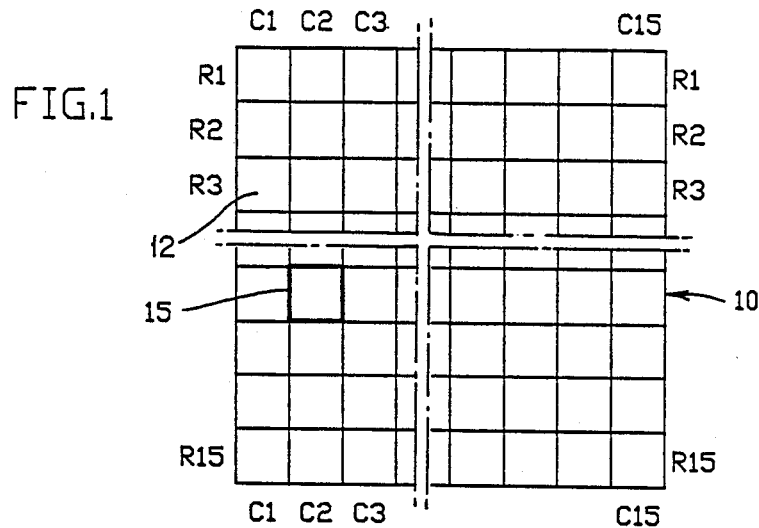
FIG. 1 is a schematic representation of a circuit chip having 15 rows and 15 columns.
Figure 2A:
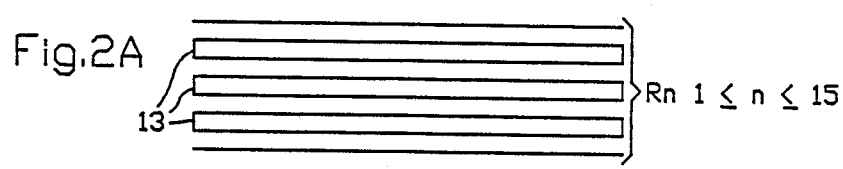
FIGS. 2A and 2B are schematic views of a row and a column, respectively, of the circuit chip. The row is shown as having three wire spaces and the column is shown as having 3 wire spaces.
Figure 2B:
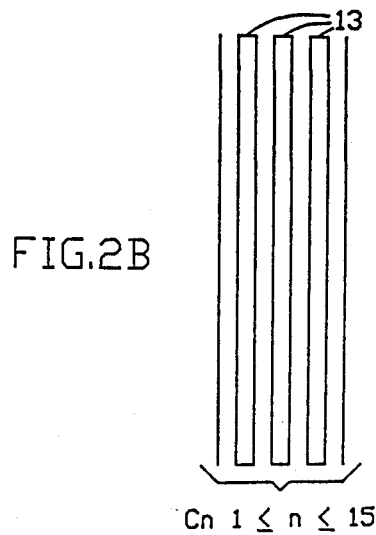

While the preferred embodiment of this invention is described with respect to wiring a chip, one could easily see that this invention has application to other uses, such as the setting up of a telephone network, a pipeline network, or in any case where a number of nodes can be interconnected using alternative paths Shown in FIG. 1 is a circuit chip 10 which is divided into columns C1 through C15 and rows R1 through R15, so that each row has wire spaces for several horizontal wires and each column has wire spaces for several vertical wires. In more general applications, the equivalent of wire spaces will be referred to as "path spaces". Generally, the columns are in one or more planes while the rows are in other planes of the chip. In order to route a path from one plane to another, vias are used to interconnect columns to rows. FIG. 2 is an expanded view of a row Rn ($1 \leq n \leq 15$) or a column Cn ($1 \leq n \leq 15$) with tracks 13 to which individual wires are ultimately assigned. The intersection of a column and a row is called a "cell" (see 15 in FIG. 1), and each cell may contain an entire circuit, part of a circuit, or portions of several circuits. The locations of all circuits are known before global wiring begins. In order to facilitate an understanding of this invention the term net is defined as a collection of points to be interconnected by, in this specific embodiment, a conductive path. A net can also include segments or paths used to interconnect the nodes. Global wiring of a net consists of connecting all the cells which contain points (see below) of the net into a common network of wires. The wires are routed along columns and rows, without deciding on exact track assignments. The final result of global wiring should not have more wires assigned at any spot in any column or row than can be accommodated.

This model (FIG. 1) of the wiring area is very flexible. It is not necessary, for example, for all columns and rows to have the same capacities. Edge columns and rows, for example, may be quite different from other rows and columns if they contain I/O circuits. The ability to vary capacities dynamically during global wiring can be a powerful design procedure for some technologies which have variable width wiring bays. It is also possible to have entire areas of a chip dedicated to predesigned entities, such as RAM (Random Access Memory). The model of wiring spaces in the cells covered by a RAM can be set to zero, if desired, so no global wires are routed through the area. The model should match the detailed wiring approach, so the global wiring solution is easily handled by the detailed wiring programs.

The global wiring procedure of this invention starts by defining an initial 'zone' for each net. The zone of a net is defined by the union of all currently permitted routings of that net. An initial zone is a subset of the total segments for interconnecting all the nodes of a particular net, in which every segment of said subset is either (1) irremovable, said irremovable segments being a part of every minimum path of the net in question, or (2) removable, in that every removable segment is part of at least one minimum path for the net in question, but is not part of every minimum path for that net.

The term minimum path will normally be a minimum length path but it will be obvious to one skilled in the art that other criterion than line length may be involved in determining a most preferred path. By minimum path we mean most preferred path for whatever problem is under attack. The preferred path could be, for example, the least cost path. An initial zone typically includes all permitted minimum length routings, minimizes parallelism and excludes unnecessary segments. Minimum length routings (minimum length paths) means that the minimum length of wire is used to interconnect the nodes of a corresponding net. If any more than the minimum length is used, then the path is not minimum length. The term permitted refers to those routings which the chip designer decides to include in the zone. This decision should be based on various anticipated overflow conditions.

Let us consider the concept of "parallelism". Suppose we wished to connect four nodes, each at the corner of a rectangle. To interconnect these four nodes, three line segments are obviously necessary, two of which are parallel. The net would of course be shorter, if the parallel segments were on the shorter sides of a nonsquare rectangle. Suppose we wished to connect two nodes falling on the same vertical column. A simple line segment would be sufficient. If a roundabout routing were pursued, in which we went horizontally right from the top node, vertically down to the level of the bottom node, and horizontally left to the bottom node, then both of the parallel horizontal lines would constitute an addition to the total length of the net.

Figure 3A:
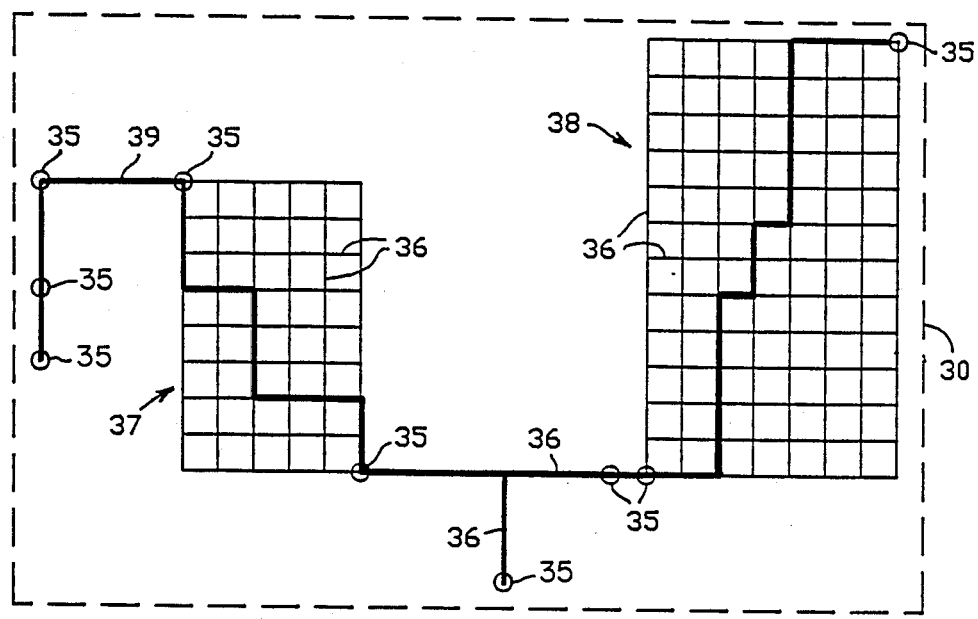

FIG. 3A shows a sample net, and its initial zone 30. The circles represent points (nodes) (35) of the net, and each line (36) represents a wire which may be used as part of a final routing. FIG. 3A thus shows all of the minimum length permitted routes (paths), which may be used to interconnect points (nodes) 35. Using minimum length routes means that there is neither unnecessary parallelism nor unnecessary segments. The net reconfiguration process (to be described below) is primarily subtractive, starts with initial zones and reduces the zones of nets until each net has just one possible routing left. Evaluation of any particular net during the reconfiguration phase takes into account the current zones of all other overlapping nets. Methods are described below for focusing on particularly congested spots.

Figure 3B:
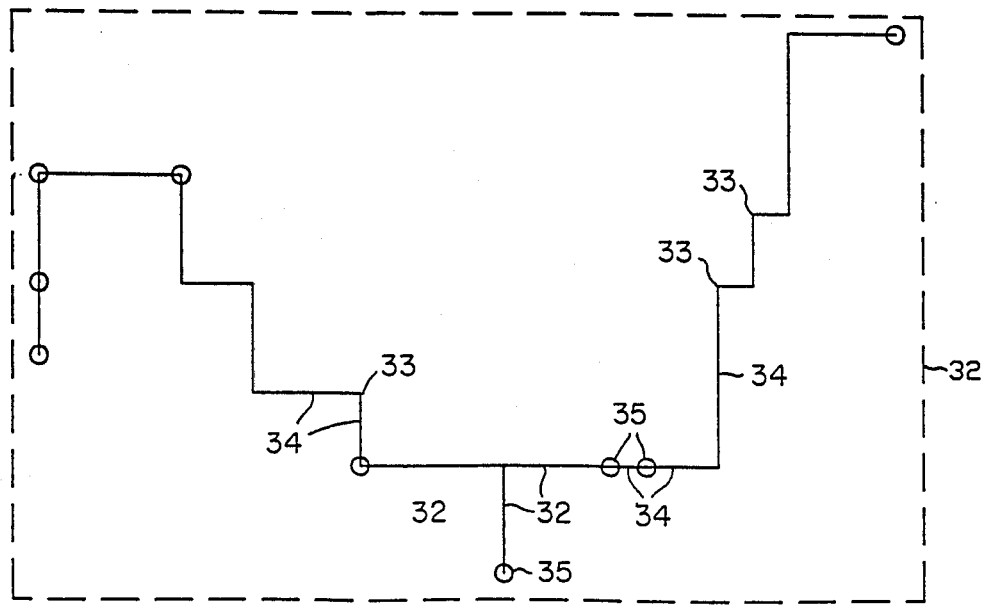
FIG. 3B shows a schematic illustration of one of the paths of the initial zone.

One of the primary inputs to the global wiring of this invention is a list of points, or cells, which must be connected for each net. This invention creates an initial zone for each net. Very simple nets may have their final routings defined as their initial zones, and their zone definition will not change. An example of a routing or path interconnecting the points 35 of a net is shown by the dark line in FIG. 3A. This path, without other permissible routes or paths, is shown more clearly in the box labelled 32 at the bottom of FIG. 3B. Also shown in FIG. 3B are segments 34. These segments are part of a path and are used to interconnect two nodes, two vias, or a node and a via. Vias 33 are also shown in FIG. 3B. The vias are used to interconnect segments on different planes of a chip. While the number 32 is also used to indicate a segment, this number more specifically indicates an irremovable segment which means that it is a segment which is a part of every minimum path of FIG. 3A. The removable paths, indicated by the number 34, means that this segment is a part of at least one minimum path of FIG. 3A. Notice also that the terms: "routing(s)", "route(s)" and "path(s)" are used interchangeably in this application. Most nets will have initial zones containing more possibilities, and later processing will eliminate all but one of these routings for each net.

Figure 4:
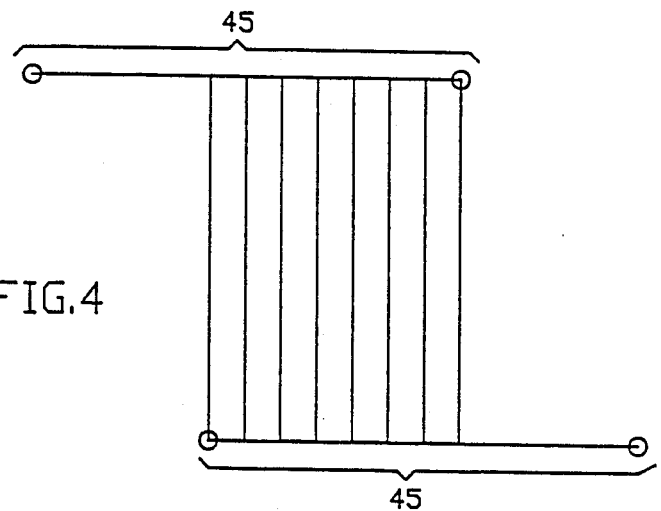
FIG. 4 is a schematic illustration of an initial zone with more redundant paths in the vertical direction than the redundant paths in the horizontal direction.

Two points of a net can have an initial zone which is a rectangle (see 37 or 38 of FIG. 3A) with the points in opposite corners, or a single line if the points are in one column or row (see 39 of FIG. 3A). Nets with more than two points, such as 30 in FIG. 3A, may be a combination of rectangles and lines. One special case of an initial zone, called a 'hybrid zone', has a rectangle where two sides (see 45 of FIG. 4) are mandatory parts of the final routing, but there is a choice of paths between the other two sides. A hybrid zone is shown in FIG. 4. In the discussion below, "rectangle" refers to a normal zone which has many options for routing, and the hybrid zone exceptions are always specifically noted.

The initial zone of each net should ideally be the union of all the minimum length routes which could be used in connecting the points of the net. However, with some nets all minimum length routes are not permitted routes as in the hybrid zone shown in FIG. 4. Minimum length routing is desirable for performance of the finished circuit. Minimum length routing also solves congestion problems more quickly. Parallelism within a net should be minimized during creation of each initial zone, or else some routings which are not of minimum length will be possible. However, if a zone is not minimal at the start, the program used in this invention will still operate successfully, and may select a minimal configuration as its final solution.

Initial zone creation requires some arbitrary choices. A net determining a rectangle would define an initial zone with both horizontal and vertical routings, although actually, one might choose one direction or the other depending upon related considerations. For example, a certain chip might have fewer vertical channels than horizontal channels. Hence, one would work harder to avoid vertical overflows. The choice could be based on reasonable factors such as length, expected congestion, and location on the chip. However, there will always be some arbitrariness in these initial zones, since it cannot be known at the start which choice is going to turn out best for design of the whole chip. The choice involves deciding which routes are to be permitted or included in the initial zone. This arbitrariness is not too harmful, since there are many opportunities later to overcome the effects of imperfect initial zones.

In defining the initial zone for a net, we take account of related factors. If traffic is quicker on the horizontal planes, we have this in mind. We also have in mind the required transits (vias) from one plane to the other. Suppose two nodes on plane A where vertical lines are routed are found at opposite corners of a rectangle. If we see an eventual solution where one horizontal and two vertical segments are required, only two vias will be introduced. On the other hand, if we seek a solution where one vertical and two horizontal segments are required then four vias are required. Hence the preferred initial zone configuration might provide a choice of all solutions involving simple horizontal lines, even though the line length of the alternative approach would be no greater.

Figure 5:
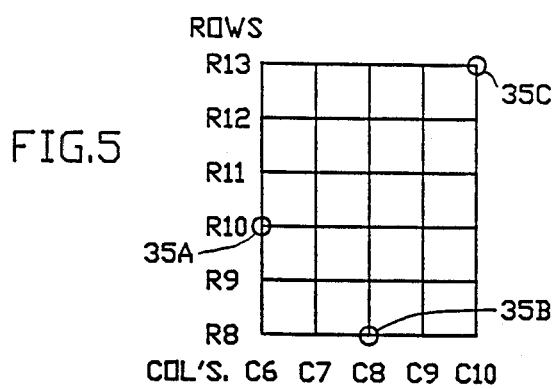
FIG. 5 is a schematic illustration of a zone with three nodes.

Let us give an example of a "zone". In FIG. 5, there are 5 columns shown (C6–C10), plus 6 rows (R8–R13). Node 35A occurs in column C6, Row R10. Node 35B occurs in column C8, Row R8. Node 35C occurs in column C10, row R13. A "zone" is simply as shown in FIG. 5, where a line has been assigned to every column and every row, showing all possible routes for connecting the three nodes. To obtain what we term the "initial zones", certain lines in the zone are removed as shown in FIG. 6.

Rows R8 and R9 have been completely dropped and rows R11, R12, and R13 partially dropped, columns C6, C7 and C9 have been completely dropped, and part of column C10. It will be obvious to anyone skilled in the art that (with the exception of column C9), none of the dropped parts would appear in a minimal wire routing of the net in question. An alternative "initial zone" is shown in FIG. 7.

Figure 6:
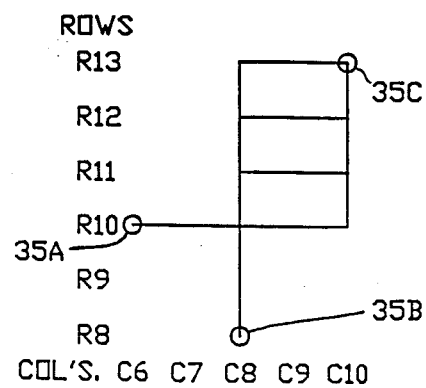
FIG. 6 is a schematic illustration of an initial zone. Please note that only minimal length paths are used in the initial zone.
Figure 7:
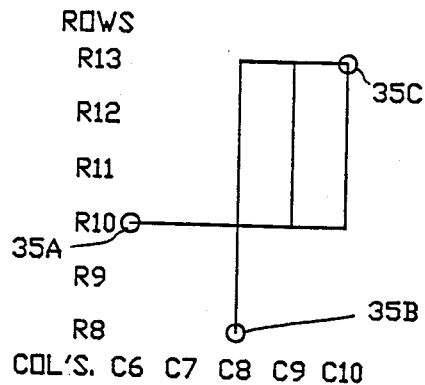
FIG. 7 is a schematic illustration of a second possible initial zone for interconnecting the nodes of FIG. 5.
Figure 8:
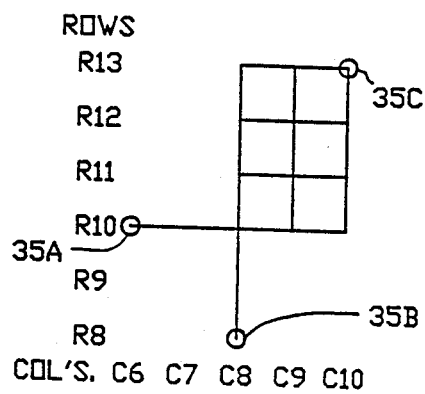
FIG. 8 is a third possible initial zone for interconnecting the nodes corresponding to FIG. 5.

FIG. 7 differs from FIG. 6 in that all of rows R11 and R12 have now been dropped, and part of column C9 has been restored. Either FIG. 6 or FIG. 7, as would be obvious to anyone skilled in the art, could serve as the "initial zone" for the "zone" shown in FIG. 5. FIG. 8 shows a third possible "initial zone".

Here the parts of rows R11 and R12 which were dropped for FIG. 7 have been restored. So it is obvious to one skilled in the art that an "initial zone" will have dropped all column lines and row lines which cannot appear in a minimal solution. All these figures are missing columns C6 and C7, plus rows R8 and R9. At least parts of rows R11 and R12, plus part of column C9 are missing from the three possible "initial zones" shown in FIGS. 6, 7 and 8.

For purposes of wire routing, it will be obvious to one skilled in the art, that we must select exactly one of the three candidates to serve as the "initial zone" for the problem under attack. Let us give some examples of the type of circumstance which would lead to the selection of one candidate over the other.

Suppose we are working on a chip which has far less vertical working space (that is, in columns) than horizontal rows. We may then select the initial zone shown in FIG. 7 since, (as will be seen when we discuss the "taking away" process) we wish to maximize our potential choice on the vertical side. Suppose, however, we are not troubled by a difference in vertical and horizontal wiring availability, but wish to reduce the number of transits (done by so-called "vias") from one plane to the next. Let us suppose that the three nodes, 35A, 35B and 35C, are directly to be reached on "plane one" which is also the plane on which vertical lines are run. The horizontal lines will run on "plane two". Connection between "plane one" and "plane two" will require at each point a "via".

Figure 9:
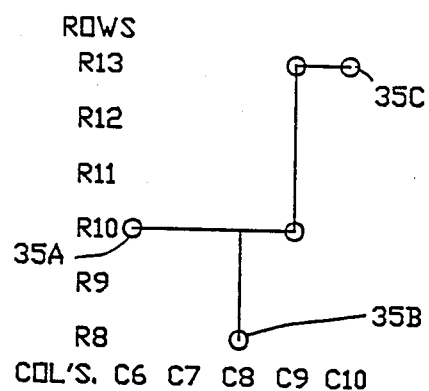
FIG. 9 is a schematic illustration of a path which could remain after deletion of paths from FIGS. 7 or 8.

In FIG. 9, we see a routing which might be reached from a "taking away" (discussed below) of FIGS. 7 or 8. FIG. 9 shows three circles (intersection of row R13 and column C10, intersection of row R13 and column C9, and intersection of row R10 and column C9). Each of the three circles represents a "via" which has been added to accomplish the wire routing shown. The routing shown in FIG. 9 could be reached, as will be obvious to one skilled in the art, by taking away from the initial zones shown in FIGS. 7 and 8, but not from FIG. 6. Hence, if our initial zone was either the one shown in FIG. 7 or 8, a solution requiring three additional vias might be required.

Figure 10:
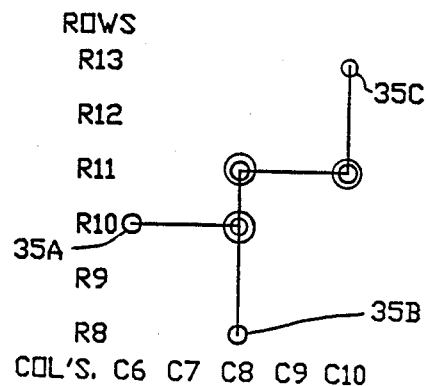
FIG. 10 is a schematic illustration of a path remaining after deletion of redundant paths from an initial zone. The three pairs of concentric circles represent vias needed to route this path.

Suppose, however, our initial zone had been the one shown in FIG. 6. FIG. 10 shows a routing that might be reached from FIG. 6.

FIG. 10 shows two circles (at the intersection of row R11 and column C10 and at the intersection of row R11 and column C8). It will be obvious that only two additional vias are required for the routing shown in FIG. 10. It is further obvious, that no routing reached from FIG. 6 will require more than two additional vias, whereas the routing shown in FIG. 9 (reached from either the initial zones shown in FIGS. 7 or 8) requires three additional vias. If for the chip in question, there was great advantage in keeping down the total number of vias, then the initial zone shown in FIG. 6 might be selected.

Let us suppose that we have in fact selected the initial zone shown in FIG. 6. The lines shown are in two categories: (1) irremovable, (2) removable. That segment in row R10 going from column C6 to column C8 is irremovable, as is that segment in column C8 going from row R8 to row R10. All the other segments shown are removable, in the sense that a routing may be reached in which the segment in question has vanished.

The "taking away" process is the removal of certain of the removable segments until a point is reached where no further segments can be removed without disconnecting the net. The unique feature of the taking away process of this invention is the method by which it is done. Let us describe that method using the initial zone shown in FIG. 6 as one tutorial example.

Let us say initial zones have been arrived at for all the nets in the problem. Now let us say that all of the lines in all the initial zones are assumed to be present in all the columns and rows. We may say we have "overlaid" all the initial zones. Suppose, for purposes of the example, that there are ten vertical channels available for each of the columns (C6-C10), and say eleven horizontal channels for each of the rows (R8-R13) The overlay process has run all the wires, from all the initial zones throughout. Let us call each intersection of a row and column a "rectangle". Since for the region shown, there are six rows and five columns, there will be thirty rectangles for the example shown. Let us suppose we compute two numbers representative for each rectangle the comparison of horizontal demand and horizontal availability plus the comparison of vertical demand and vertical availability. The rectangle representing the intersection of row R11 and column C8 might have a vertical demand of 15 wires and a horizontal demand of 18 wires. That is, after all of the vertical and horizontal wires have been added in the overlay process, there are 15 vertical wires and 18 horizontal wires hitting the box in question. Since we have only space for ten vertical wires and eleven horizontal wires, it will be obvious that the rectangle being discussed has a vertical overflow of 5, and a horizontal overflow of 7. Let us represent this by the configuration shown in FIG. 11.

Figure 12:
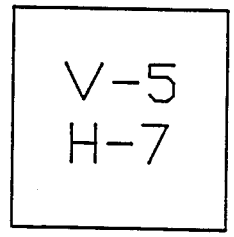
FIG. 12 is a schematic illustration of an array of cells showing the respective vertical and horizontal overflows. This array corresponds to the wire spaces used by the initial zone of FIG. 6.

Now let us say that after the overlay process we have reached the overflow situation shown in FIG. 12 for those boxes involving removable lines for the initial zone shown in FIG. 6.

Suppose we have to decide between the removal of the top, horizontal line (row 13) or the bottom (row 10). It will be obvious to one skilled in the art, that a variety of methods for evaluating preference might be used, but suppose for purposes of the example we wished to reduce the largest single overflow, vertical or horizontal. The box representing the intersection of column C9 and row R10 contains a horizontal overflow of 10. Hence, we elect to remove the horizontal segment in row R10 from column C8 to column C10, plus the vertical segment in column C10 from row R10 to R11. Any path passing through the segments horizontally from column C8 to column C10 in row R10 and vertically from row R10 to R11 in column C10 would be eliminated since such path has the worst score of any paths in the zone of FIG. 12.

The left to right scoring in the three boxes from columns C8 to C10 in row R10 may now be updated to V-6,H-3; V-3, H-9; V-1,H-5; if this is the scoring left after the removal cited.

Figure 13:
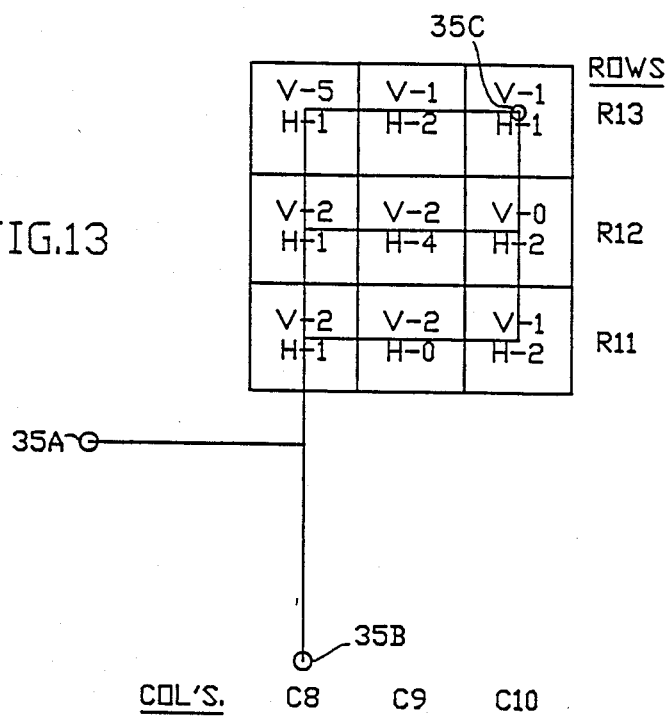
FIG. 13 is an updated version of FIG. 12 with a path passing through R10 removed and showing the comparison of the demand for and the supply of wire spaces updated due to removal of some redundant paths.

We now may temporarily leave the net under attack and make removals from other initial zones for other nets. Now let us say by some reasonable strategy of scheduling removals we return to the net in question. Since lines might have been removed from other nets, we might have lower scores in the boxes. Suppose we encounter the situation shown in FIG. 13.

Let us say our program dictates that one will choose between removing the horizontal segment on row R13 from columns C8 to C10 plus the vertical segment in column C8 from rows R12 to R13; or alternatively, we will remove the horizontal segment in row Rll from columns C8 to C10, plus the vertical segment in column C10, from row R11 to R12. By the largest single overflow criterion cited earlier, the vertical overflow in the box representing the intersection of row Rl3 and column C8 may be reduced from −5 to −4. Hence, we make the former of the two removals cited above, that is, we drop the horizontal segment of row R13 from columns C8 to C10 and the vertical segment in column C8 from rows R12 to R13.

Figure 14:
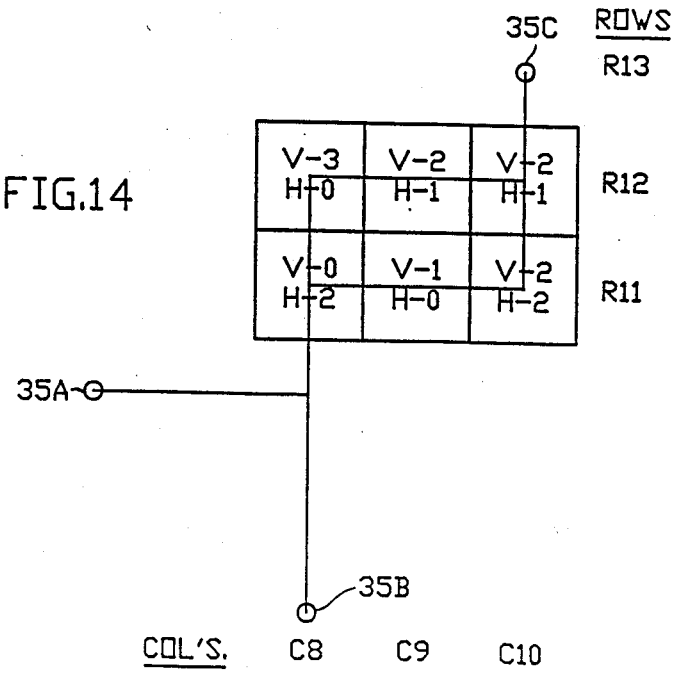
FIG. 14 is an updated version of FIG. 13 with a path passing through R13 removed and showing the comparison of the demand for and the supply of wire spaces updated due to removal of other redundant paths.

Let us assume that we now remove segments from other nets and when we finally return to the net in question, we encounter the circumstance portrayed in FIG. 14.

Because the box representing the intersection of row R12 and column C9 contains a horizontal overflow of −1, we now remove the horizontal segment on row R12 from columns C8 to C10 and the vertical segment in column C8 from rows R11 to R12. We are left with the routing for this net which was shown in FIG. 10. It will be obvious to one skilled in the art that methods for making reasonable choices of segments to be removed can be adjusted to suit various needs, the total discussion of which goes beyond the scope of the present invention. Under certain conditions, for example, vertical overflows might be considered more serious than horizontal, and so forth. We might also choose to drop internal horizontal segments before external ones, say dropping row R12 before we drop either rows R13 or R10, but such program adjustments are all within the scope of the present invention.

In determining overflow conditions, wire crossings are generally counted at the edges of cells, but can be counted at cell centers. The number of available wiring spaces at each location is determined before global wiring starts. After all nets are initially routed, the numbers of wires passing these points is known. This invention then compares the available spaces ("supply") to the number of passing wires ("demand") to determine where the overall configuration of wires must be modified.

After initial zones are defined for all nets, their cumulative wiring demand is determined. Where a zone consists of a single connection wire, each of the global cells through which the wire passes is assessed a demand for wiring space sufficient for that wire. Where a zone consists of a rectangle, its demand is calculated as if the net had several wires running in parallel horizontally across the rectangle and several wires running vertically across the rectangle. Each of the global cells within the rectangle contains both vertical and horizontal wires for the net. Zones of most nets include both rectangles and wire segments, so some cell scores are affected one way and some the other. In some cases, as we have noted above, it is also useful to score "vias", or corners in paths.

Congestion numbers for the design can be generated by subtracting the demand numbers from the supply numbers in each cell. Areas where the demand exceeds the supply will have negative results, indicating overflow conditions. Analysis of vertical and horizontal overflows will reveal that some areas have congestion only on one plane. Congestion measures can be useful to designers in controlling the global wiring process, and can be used internally by the programs to control a variety of actions. Later in the discussion, we shall show computer run results for a complete problem solution including a diagram showing the scoring after all initial zones have been overlaid. All the basic features of the invention will be illustrated.

One variation of the scoring process treats "committed" and "optional" demand separately. That is, some of the wires in a zone may have no alternative, and so their demand can be called "committed". Other wires have alternatives, so they can be called "optional". If most of the demand in a cell is "committed", the overflow problem there is more severe than if the demand is mostly "optional". By taking this into account when accumulating penalty weights for all cells in a path, the rerouting process can be directed to attack the more difficult congestion problems. When choices are made, optional demand counts are decreased and some committed demand counts may be increased.

"THE TAKING AWAY" PROCESS

The "taking away" process removes extra paths from nets, until there is just one routing left for each net. After the initial scoring is completed, there are probably many areas of severe congestion. This is only a temporary situation, and somewhat artificial, since many nets have multiple paths. This invention processes all nets which have extra paths, perhaps using a different order for each pass through the nets. The extra paths of a net refers to a net which still has multiple choices available as to which path will ultimately be chosen for final routing. Each net is examined to see which of its redundant paths contributes most to congestion problems, and that path is then eliminated. Where more than one path are equally bad, the decision about which to eliminate can often be postponed, so decisions made about other nets can be taken into account. Similarly, nets which are extremely flexible, with more possible routings, may have all decisions postponed until more constrained nets have selected their best paths. Whenever a path or portion of a path is eliminated, the scores for the affected cells are updated.

Evaluation of a path, or a portion of a path, must take into account the overflow situation in each of the cells along the path. Overflow is calculated by subtracting demand from supply. Simply accumulating the overflow values would not provide a good basis for comparison to other paths, so a set of penalty values, or weights, are used. The weights can be changed for a variety of reasons during global wiring, but heavy penalties are usually given for severe overflows, lighter penalties for small overflows, still smaller penalties for cases where supply is barely adequate, and no penalties where supply significantly exceeds demand. Note that it is a particular path which is being scored, so a line passing through a cell may be penalized for its horizontal or vertical contribution but not both, even if the zone of the net has both vertical and horizontal paths running through the cell. Total scores for paths can also include penalties for vias and other factors. The path gets a total score which can be directly compared to other path scores, so the worst can be easily identified.

One variant of taking away which minimizes penalty weight calculations and simplifies the zone definition data is the following. For each rectangular zone, the initial zone includes parallel wires only vertically or horizontally, but not both (see "horizontal/vertical biasing" below). The taking away only scores the parallel paths at opposite extremes (top and bottom or extreme left and extreme right), so when a path is eliminated the rectangle shrinks. This is much easier to program than approaches which might fragment rectangles in successive passes, and this also runs faster. Elimination of a minimal path from the middle of a hybrid zone does not fragment the zone in the same way as a normal rectangle because two of the hybrid zone sides must be retained in the final configuration. Hybrid zones can more easily have all possibilities considered and any one of the excess parallel paths across the zone might be eliminated without complicating the bookkeeping too much.

The routings which remain after the initial taking away process may be a satisfactory final wiring solution. This would be ideal for circuit performance, since all routings would be minimum length. However, this is not expected on any difficult designs. If it occurs there are probably extra wiring spaces, and the design is very easy. It is expected that the initial taking away will handle "easy" congestion problems, and leave "difficult" congestion problems at some spots on the chip which can only be solved by adding more lengths of wire to some nets.

After the initial taking away procedure has finished working on all of the nets, in all regions of the chip, the emphasis of the invention changes to attacking the remaining overflow areas directly. This involves recreating some of the net zones (as described below), and then using the taking away procedure again to find new routings for those nets.

"BOXING" PROBLEM SPOTS

This invention has a significant ability to focus on problem areas in the design. A "box" can be created around any set of adjacent cells, usually creating a rectangle around a problem area. A box might contain one important overflow, several overflows, or any other supply versus demand situations. The region within the box is where rerouting occurs. The box may be "small" or "big", depending on the number of non-problem cells which are included to facilitate rerouting. Focusing on small areas by using boxes limits the amount of work that must be done by the program, which helps keep run time down. The box is a very powerful and flexible concept, with a variety of uses.

Zones in the regions outside the box are held constant and are not changed. By isolating the region to be attacked, a new set of expanded zones totally within the box can be created, and a new taking away process undertaken, focusing directly on the overflows captured by the box. This insures that no changes will affect regions outside. The box approach can be used to keep congestion problems from simply oscillating between two nearby locations, and to keep the solution process constantly moving forward.

Once a box has been defined, all nets which pass through the box area may be identified as possible candidates for rerouting. One variation which is most appropriate in the early stages of rerouting is to identify just those nets which contribute directly to overflows. Inside, expanded zones are created for all these nets, in a procedure which is similar to initial zone creation above but which works only on those portions which are inside the box. The points at which wires enter the box are treated as primary connection points of the net, so any rerouting inside the box will still connect to the wiring outside without requiring any changes to wires outside the box. The expanded zones created within the box will normally differ from the initial zone configurations of the nets in question, and will normally permit additional paths to be considered. Once all such expanded zones are created, the program recalculates total demand and then performs the taking away procedure to get the new routings within the box.

Boxes defined early, just after the initial taking away, will generally be small, so problems can be solved with a minimum of additional wire and a minimum of additional computation. Problems which resist solution by small boxes are attacked later by larger boxes. Big boxes permit more extensive rerouting, so more difficult problems can be solved. Big boxes are not used unless necessary because they require more computation, and they tend to introduce more wire lengths.

HORIZONTAL/VERTICAL BIASING

Zone creation can deliberately constrain rerouting, to solve problems without introducing too much additional wire, and to avoid convoluted paths with many bends. Additional wire refers to non-minimum length routings of nets. Constraints are valuable early in the process, since introduction of too much wire can make later improvements more difficult. Some problem areas may contain overflows on just the horizontal or just the vertical plane. In these cases, putting emphasis on just one plane can be quite effective. Within one box, for example, rectangular zones can be created with many parallel horizontal wires and just two verticals along the edges. This would be appropriate for solving a horizontal overflow problem. To emphasize the other plane, the same rectangle could have many vertical wires, and horizontals at just top and bottom.

Some boxes will have overflow problems on both planes. It is worthwhile to try solving these problems with constrained rerouting too, to avoid long convoluted paths. A series of passes can be run, where first the boxes emphasize horizontal parallelism and then vertical parallelism. Another approach is to have some of the new zones within a box created with horizontal parallelism and other zones with vertical parallelism.

ZONE EXPANSIONS

As the routing proceeds, some problem areas may prove particularly troublesome. In these areas the overflows may be solved by allowing more rerouting possibilities than are provided by the normal zone creation which generally includes only minimum length paths. In this case, expanded zones might include simple expansions of rectangles, or transformations of lines into rectangles. The amount of zone expansion can be selected to match the box size, horizontal or vertical bias, stage of problem solution, location on the chip, and other factors.

ATTACKING PERIPHERAL ZEROS

Sometimes an overflow will be surrounded by zeros, (supply minus demand =0), so that successful rerouting in a small box is not possible. In these cases it is necessary to attack the peripheral zeros, at the box edges, to make room for rerouting away from the overflow. This is done by insuring that the box is large enough to include some cells which have room for additional wires, and reestablishing zones for those nets which contribute to the zeros as well as those nets which contribute to overflows.

IMPLEMENTATION EXAMPLE

Figure 15:
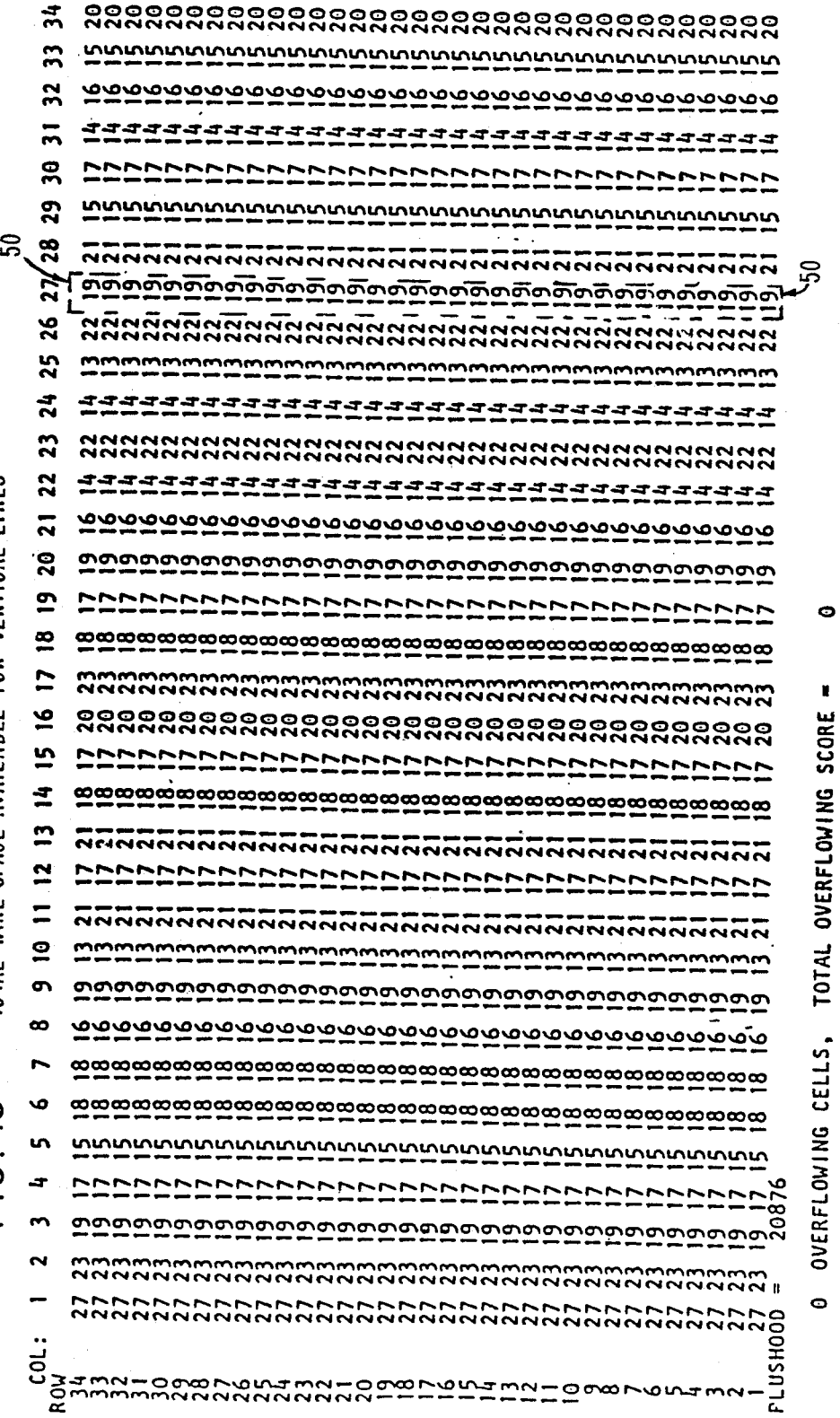
FIG. 15 is a schematic illustration of the wire space available in vertical columns of the chip.

The concepts of this invention have been embodied in computer software which has been utilized in chip design. We now present a complete series of runs used to solve the global wire routing for a complex and very difficult chip design. Actual computer printouts are the basis of the different figures cited. In FIG. 15, the wire spaces available in each vertical column are indicated. For example, in column 27 there is enough wire space for (see 50), 19 wires. In FIG. 16, we see the wire space available in each horizontal row, most of which have enough space for 22 wires (see 60).

Figure 21B:
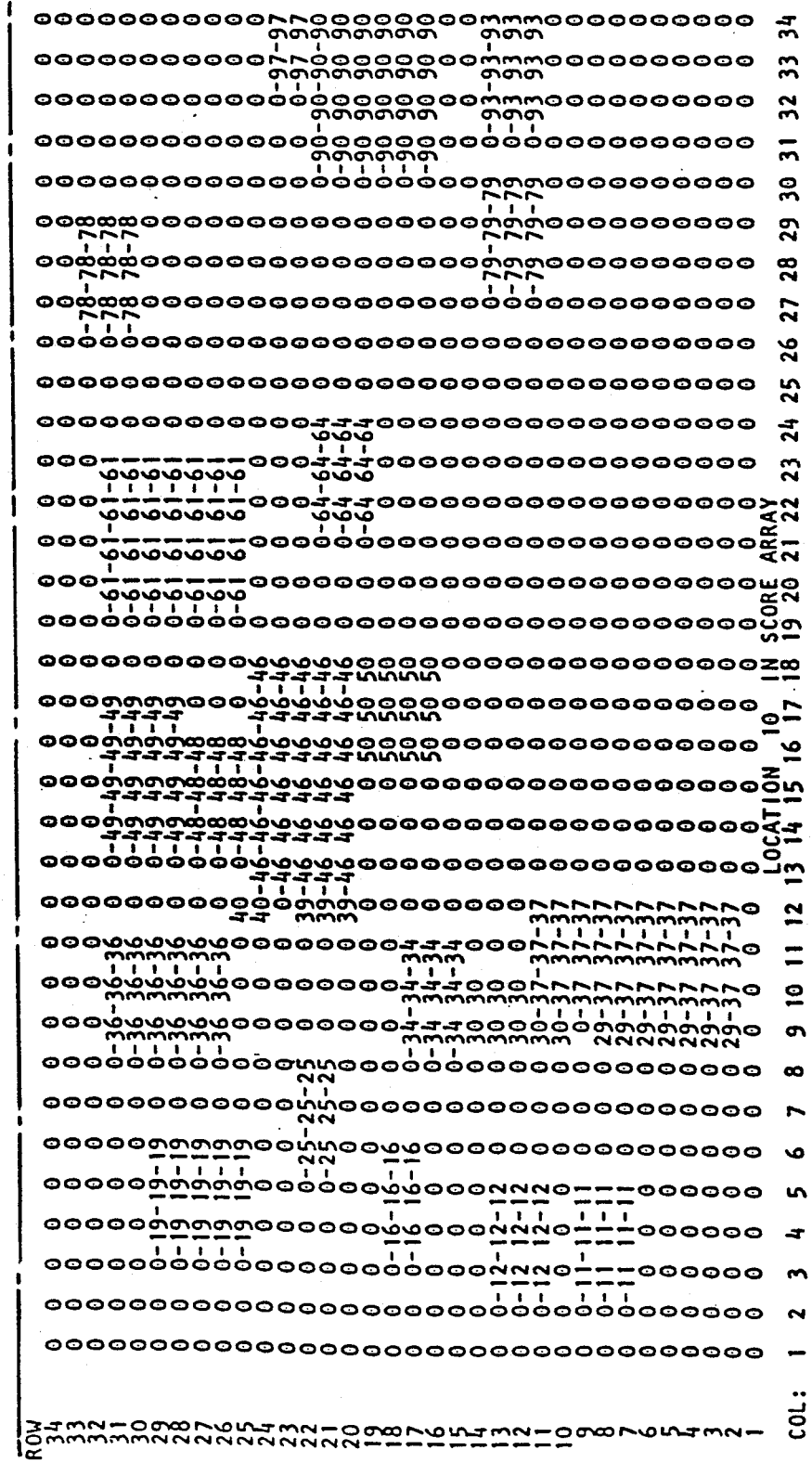
FIG. 21 shows selected areas where demand for wire spaces exceeds supply.
Figure 30B:
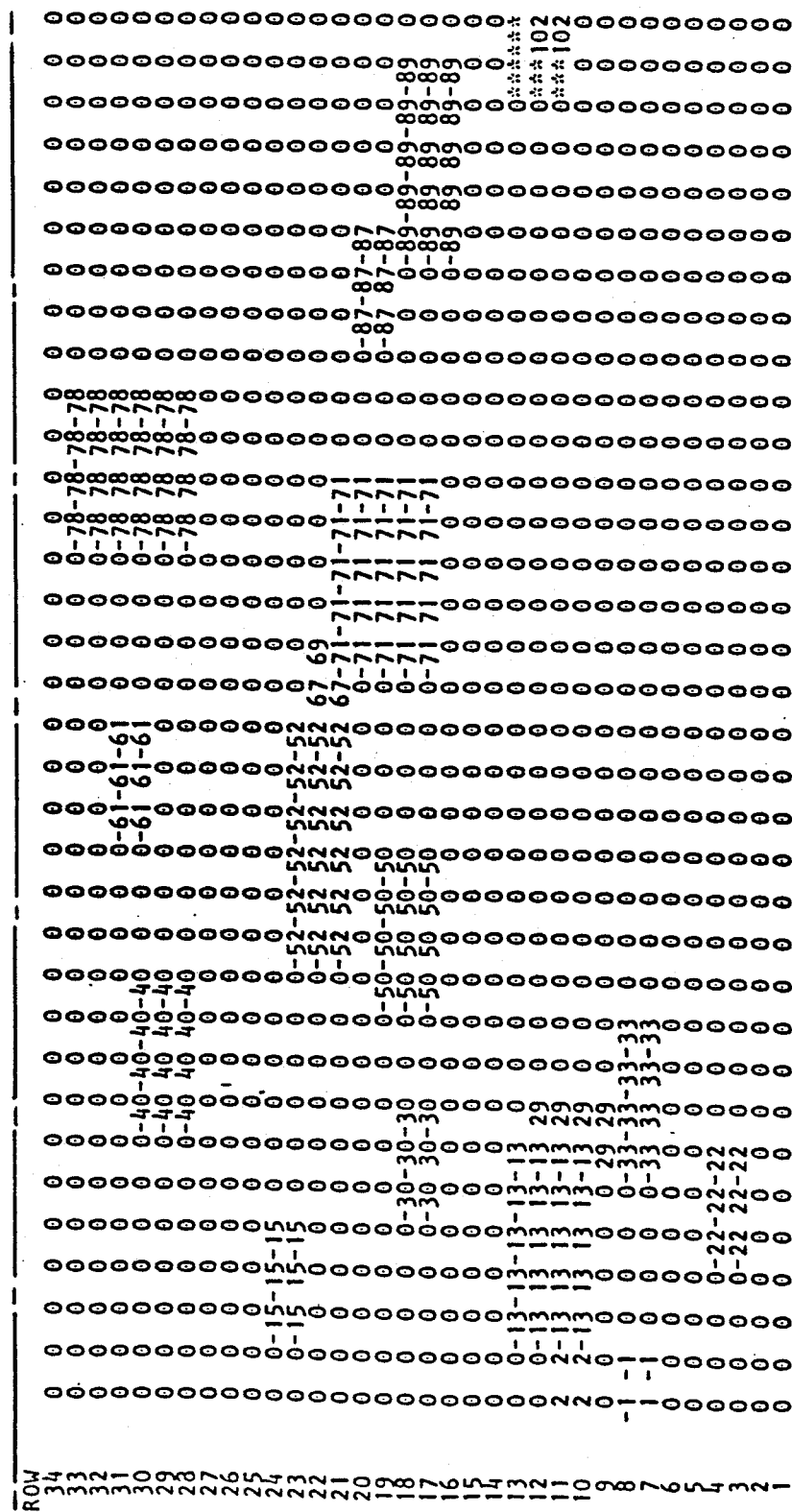
FIG. 30 shows additional areas where expanded zones were generated.

For this problem, we are presented with a 34×34 array of cells. In FIG. 17, we see the vertical overflows, after the overlay of all the original initial zones of nets. In FIG. 18, the horizontal overflows are shown after the overlay of the original initial zones of nets. The horizontal overflows very much exceed the vertical ones, because the configuration of the initial zones has maximized the horizontal choices, so as to minimize (as explained above) the number of vias required for the majority of nets. In FIG. 19, we see the vertical overflows left after the taking away process. In FIG. 20, the horizontal overflows are shown after the taking away process. There are substantially fewer horizontal than vertical overflows at this stage of the solution, because as indicated above, the horizontal side was favored in the forming of the initial zones for nets. In FIG. 21, some of the boxes surrounding overflows which were generated by the computer are shown. The different numbers (for example, 36, 46, 79, and so forth) serve as names of the boxes in question and identify the position of the cells therein. In FIG. 22, the vertical overflows created by the forming of expanded zones inside boxes are shown. In FIG. 23, the horizontal overflows resulting from the expanded zones inside the boxes are shown. Because there were so many more vertical overflows than horizontal after the original taking away process, the program now maximizes vertical choices for the taking away which will now take place inside the boxes. In FIG. 24, the vertical overflows after the taking away inside the boxes are shown. As can be seen, this step has reduced the vertical overflows from 692 to 391. In FIG. 25, the horizontal overflows after the taking away inside the boxes are shown. Since the primary focus was on the elimination of vertical overflows, no improvement is registered here. The new position achieved differs greatly from the overflow position before the run. New boxes were formed, and the process was repeated resulting in reduced vertical and horizontal overflows. FIGS. 26 and 27 show that the resulting overflows obtained are reduced to 279 on the vertical side, and 186 on the horizontal side. A box run was then made favoring the horizontal side. The results are shown in FIGS. 28 and 29, the horizontal overflows reduced to 95. The strategy of changing the target of attack is normally an effective tactic in such large scale problem solving, since continual changing of positions enables the basic optimizing machinery to operate at maximum efficiency. Some boxes were also formed by the program in later runs as shown in the example of FIG. 30. The tactic of shifting targets can be enhanced in a variety of ways. One of the most effective is to use the methods in question where a universal bias of −1 or −2 has been introduced at all positions. Thus the program used to implement this invention works on a 0 cell as if it were a −1. A great deal of new computation occurs, subtly shifting the position. Runs made without biases after the bias runs then find new opportunities to eliminate overflows. FIGS. 31 and 32 show the overflows obtained after bias runs of −1 or −2 followed by a new bias run. It should be emphasized that the only algorithms employed are the ones presented in the current invention, which adopts easily to the shifting target tactic.

Before continuing with the figures detailing computer runs currently under discussion, we may perhaps by two analogies render more plausible the shifting target tactic just mentioned. In the spring, pockets of ice remain in crevices of rocks because the sun daily rises from a near identical position and daily follows a near identical path. Surrounding rocks which shield the ice do not change position. If the overall path of the sun could be modified or the position of the surrounding rocks could be shifted somewhat, then the melting power of the sun would melt the ice and eliminate it. Peas in a sieve were mentioned earlier. Peas may form group configurations after a while over the various holes which prevent the individual peas from falling through. By jiggling the sieve, the universe, we break up many such configurations so that peas may now fall through the holes. To solve the problem most efficiently, we do not wish to sustain an essentially static status quo.

Figure 33:
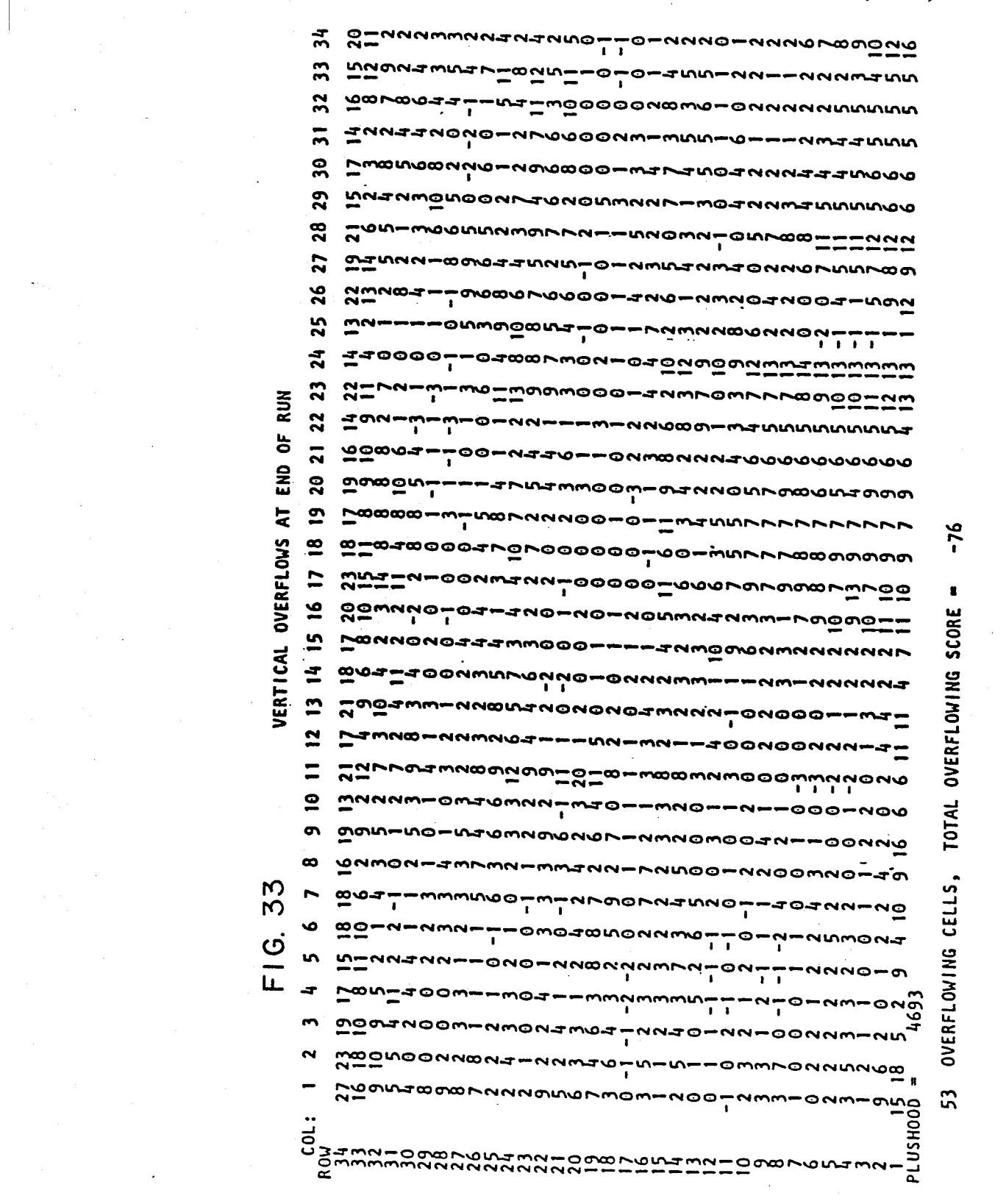
Figure 35A:
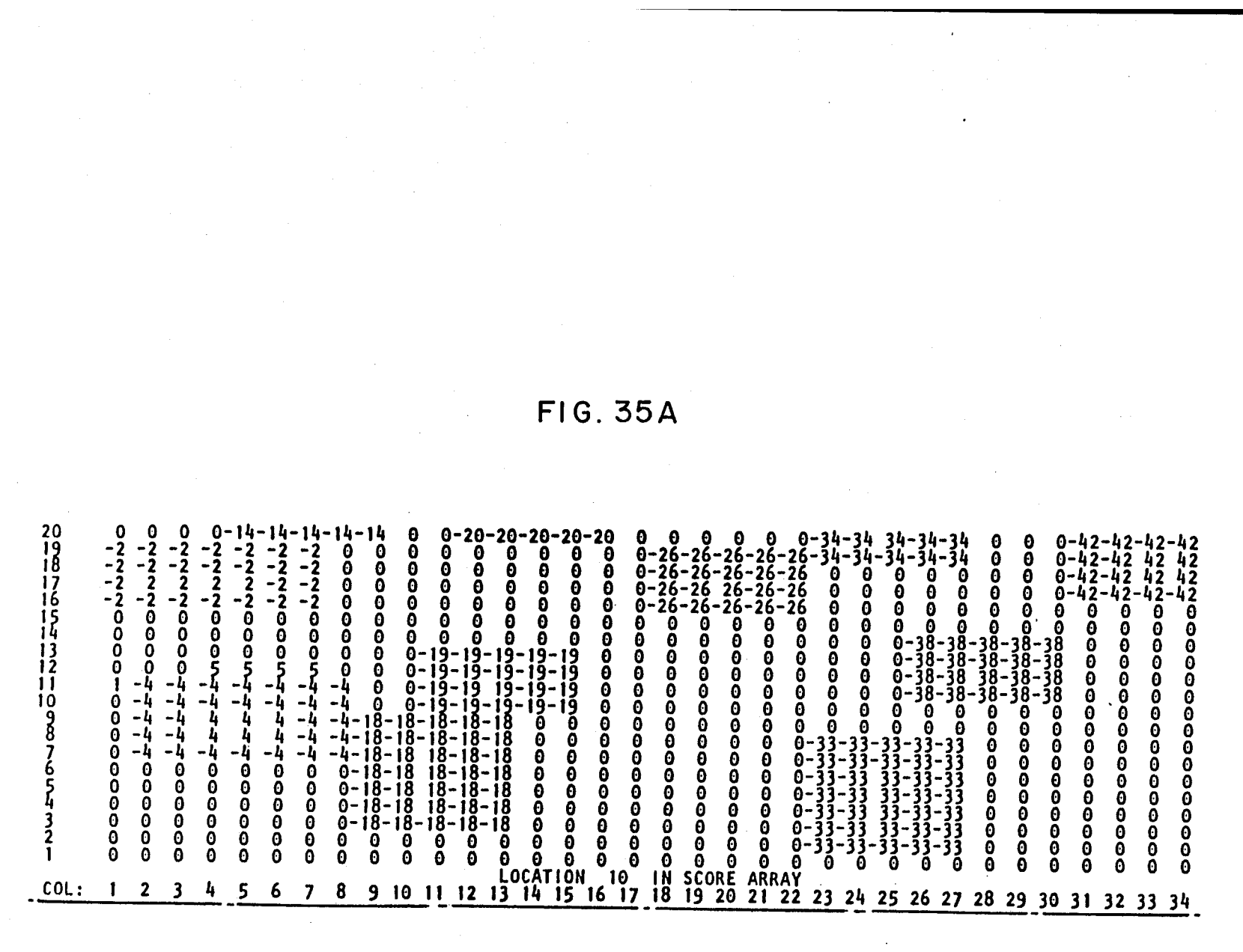
Figure 35B:
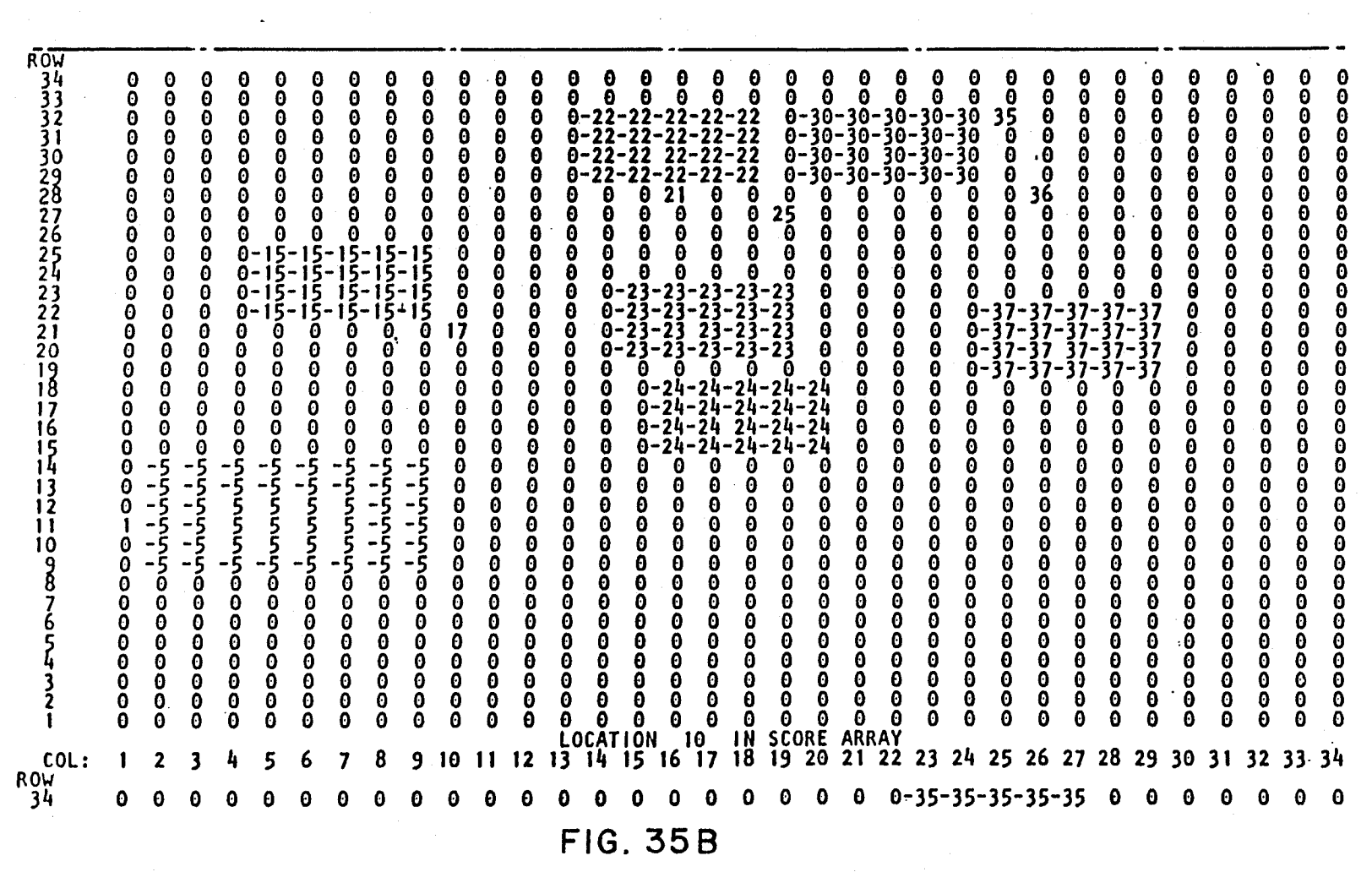

Additional runs using the methods set forth above were conducted, and the resultant overflow values shown in FIGS. 33 and 34 were obtained. It will be noted that the method is designed so far as possible to eliminate overflows without introducing unnecessary parallelism. If for example, the overflows are surrounded by underflows and no nets to this point have been routed circuitously, then it will be obvious to the reader that if a small number of overflows exist, having resisted the current approach, we can follow slightly circuitous paths on a small number of nets (given the substantial underflows), and eliminate all overflows rather easily. FIG. 35 shows some boxes formed by the program in further runs.

Figure 36:
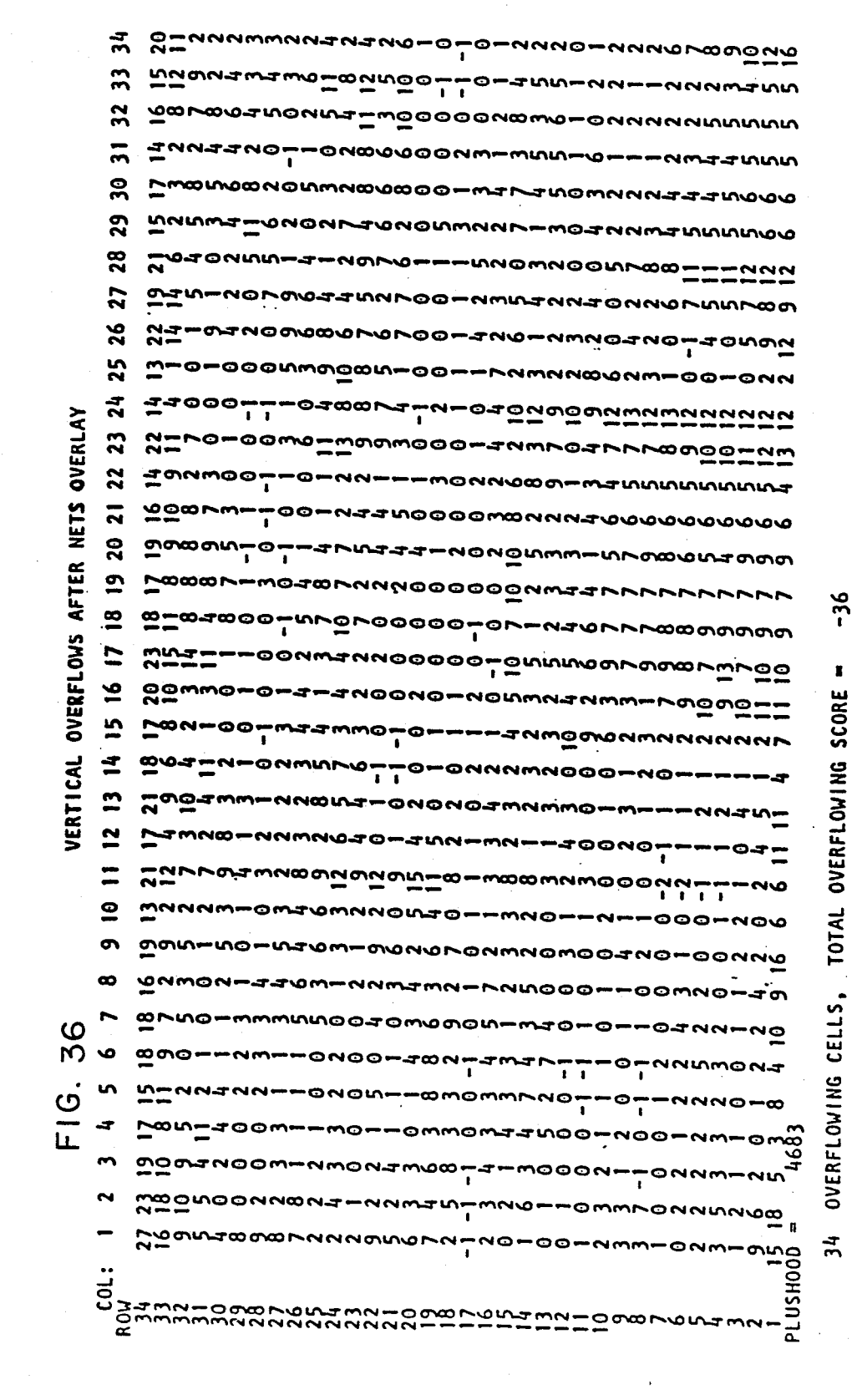
Figure 37:
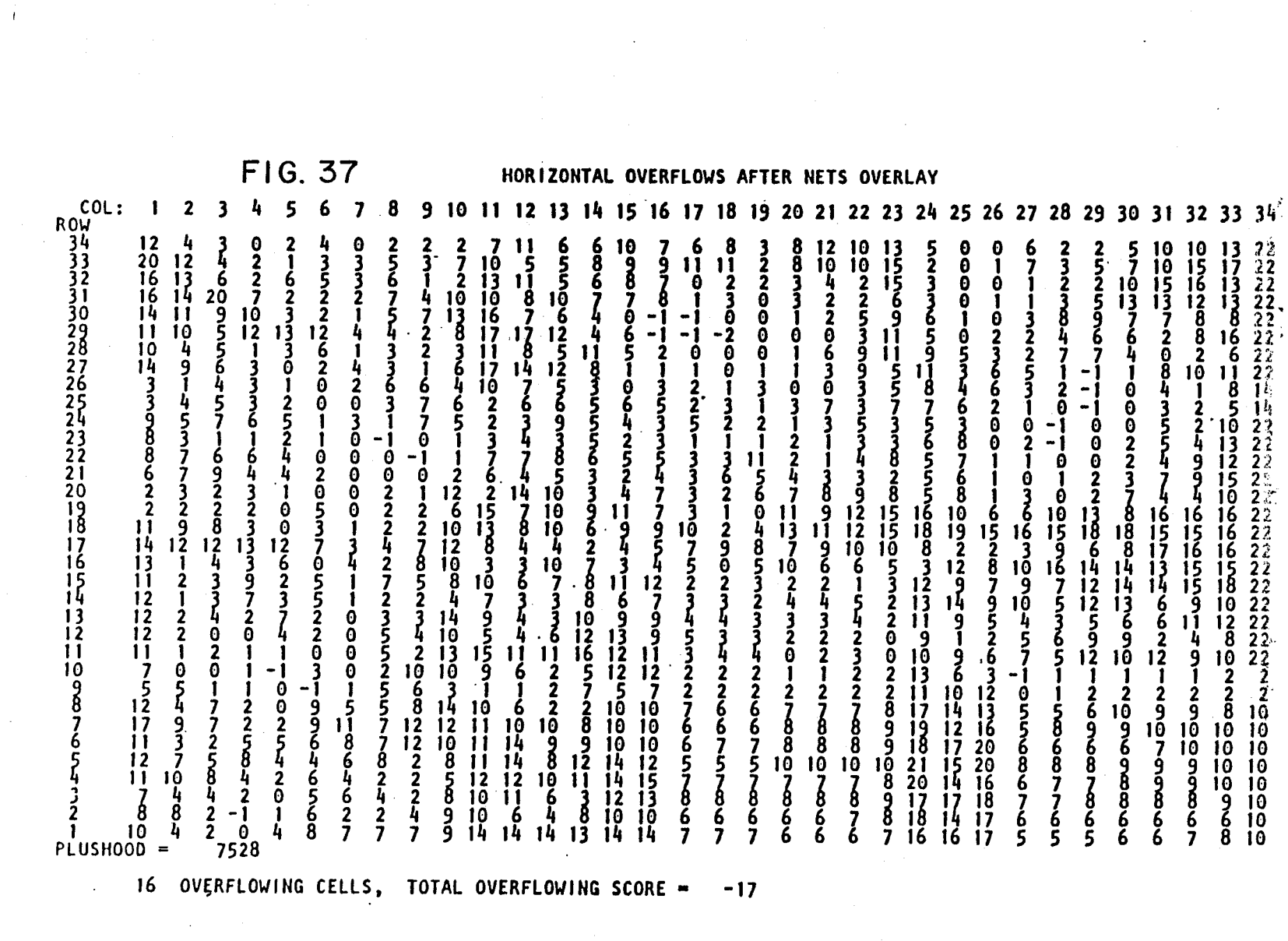

Another method for shifting the problem is to change the underlying scoring, so as to intensify the attack on overflows. Let us say, hypothetically, every 1 reduced to 0 was given a penalty of −2, every −1 raised to a zero was given a bonus of +5, every −2 raised to a −1 a bonus of +7, and so on. Certain moves would be winners; others, losers. Early in solving a large scale problem, it is important to avoid attacking the overflows too strongly, since this may create an unfavorable position. Later, however, if we have very limited overflows and considerable underflows, we may stimulate new moves by reducing certain penalties and increasing certain bonuses. All of this is, of course, easily accommodated using the methods of the invention. FIGS. 36 and 37 display the vertical and horizontal positions reached after box runs using adjusted scores. There are at this point 36 vertical overflows and 17 horizontal overflows.

At this point, the program attacked the remaining overflows with a series of segment moving runs capable of introducing additional wire length to avoid overflows. It should be emphasized that such methods would have proved ineffective if applied to the problem at a much earlier stage, but only worked so effectively near the end because the methods set forth in the invention had achieved the late tractable position just described. A final position of zero vertical and zero horizontal overflows was automatically achieved.

Figure 45:
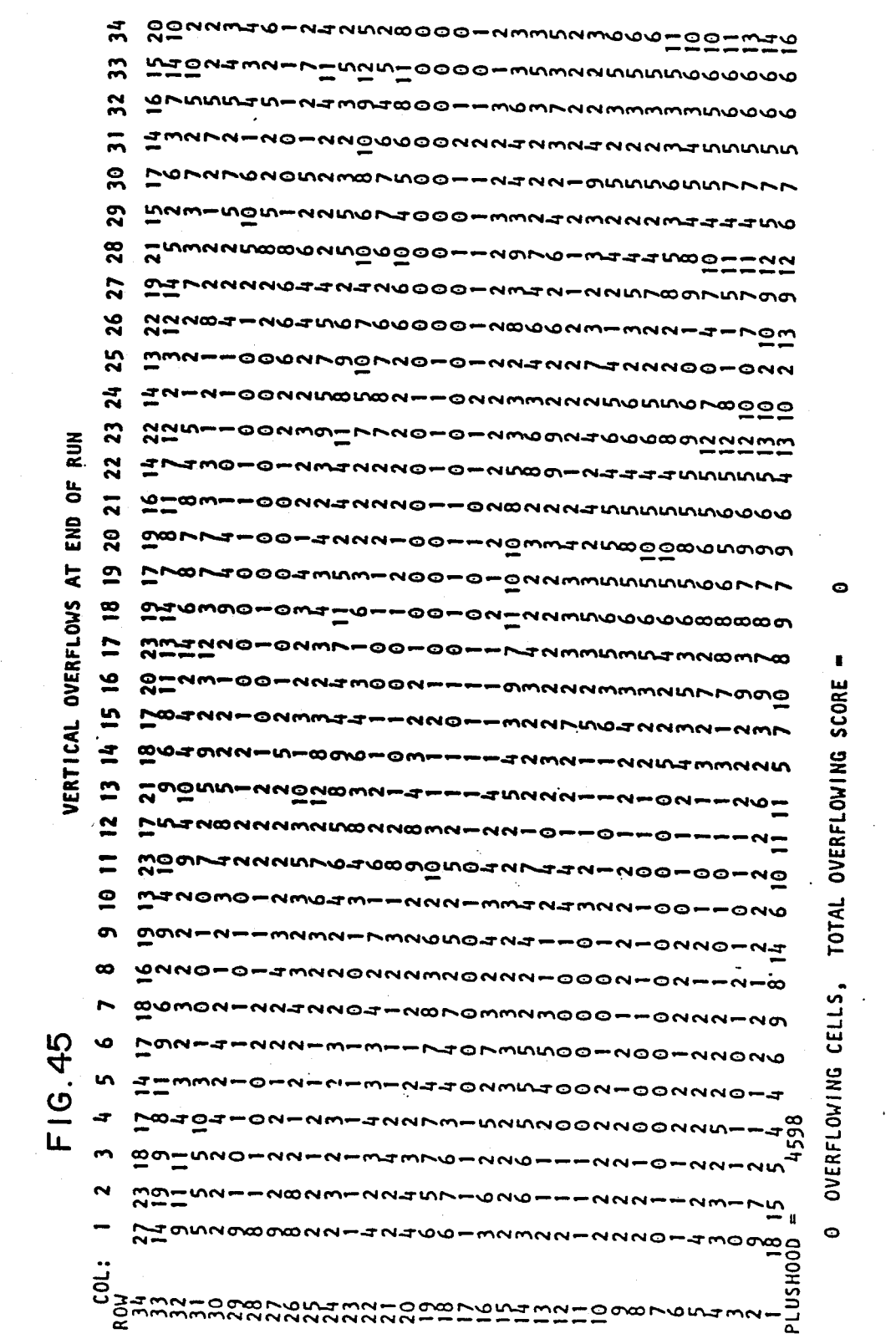
Figure 46:
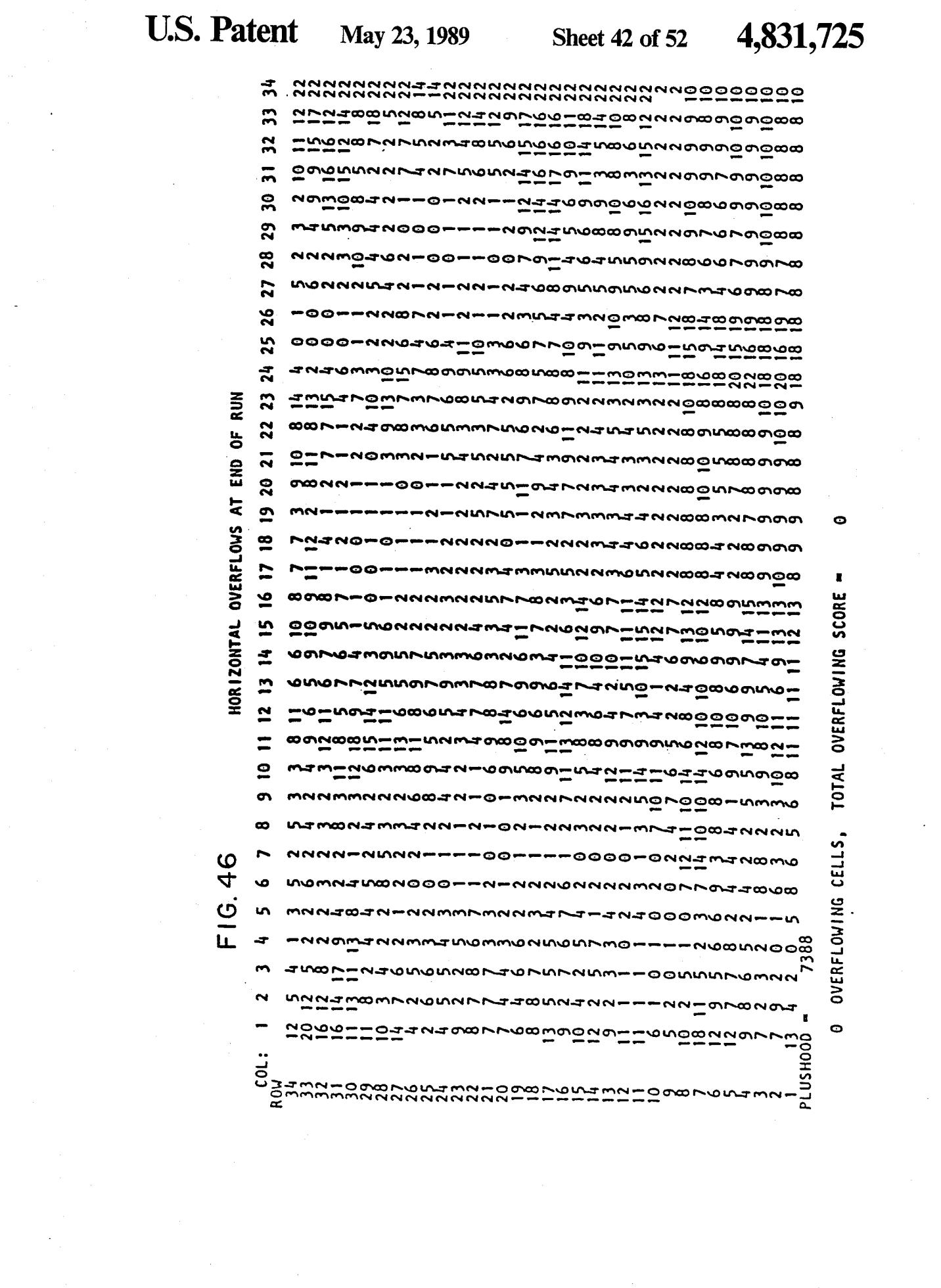

FIGS. 38 to 44 provide a succinct summary of all the runs mentioned above. The transition from the methods of the invention to the segment moving runs can be seen on FIG. 42. It should be pointed out that the current status of the software embodiment of the invention led to a number of superfluous reruns. This can be corrected and does not bear upon the basic invention. All the runs were made during a single day, November 15, 1987. Although the current state of the software required multiple runs, the introduction of a relatively obvious control would enable the whole series of runs to be accomplished in a simple run. FIGS. 45 and 46 show the final position reached without vertical or horizontal overflows.

Figure 47:
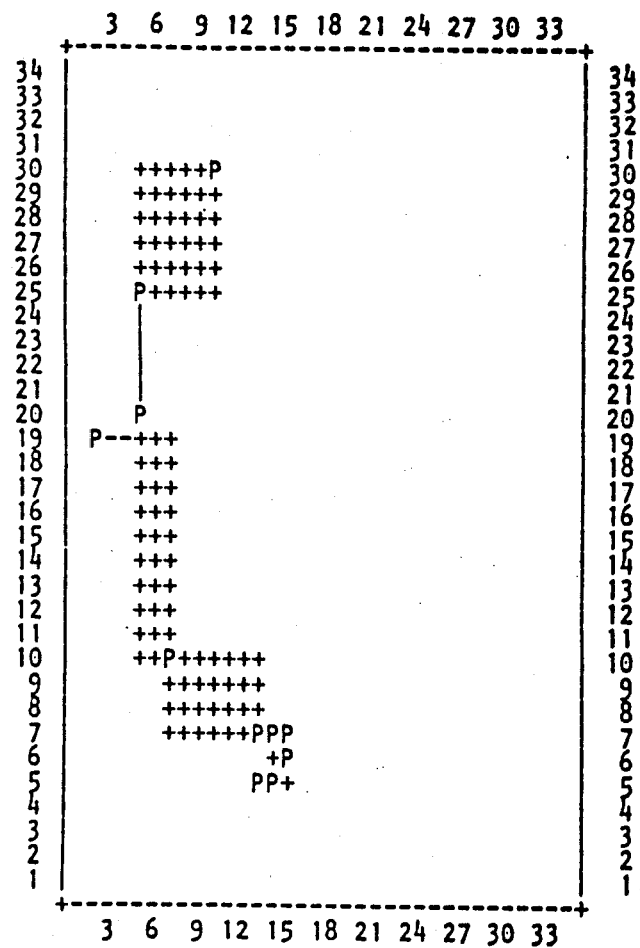
FIG. 47 shows one of the initial zones used in this preferred embodiment.
Figure 48:
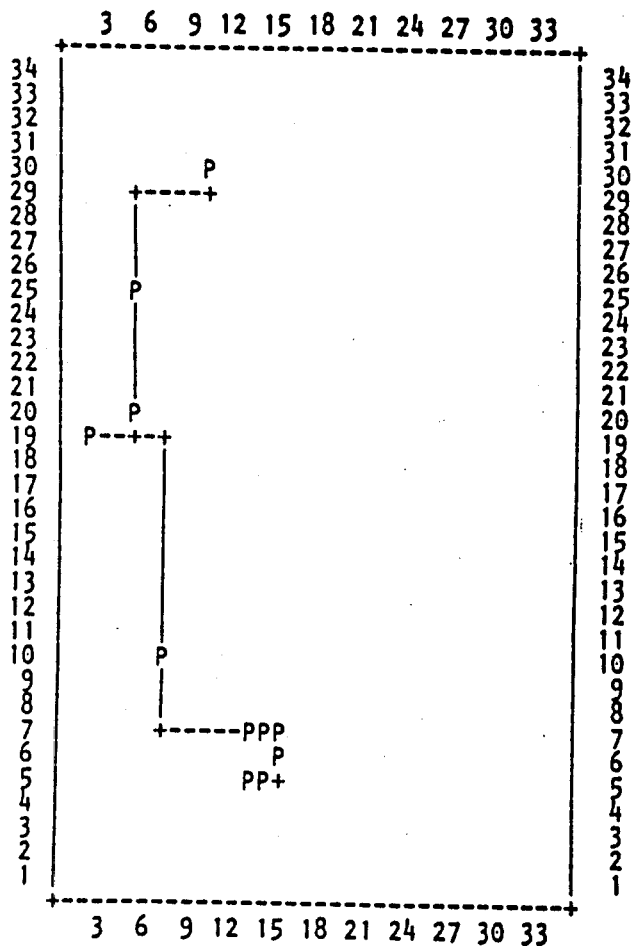
FIG. 48 shows a wire path after deletions of redundant wire paths from the initial zone of FIG. 47.
Figure 49:
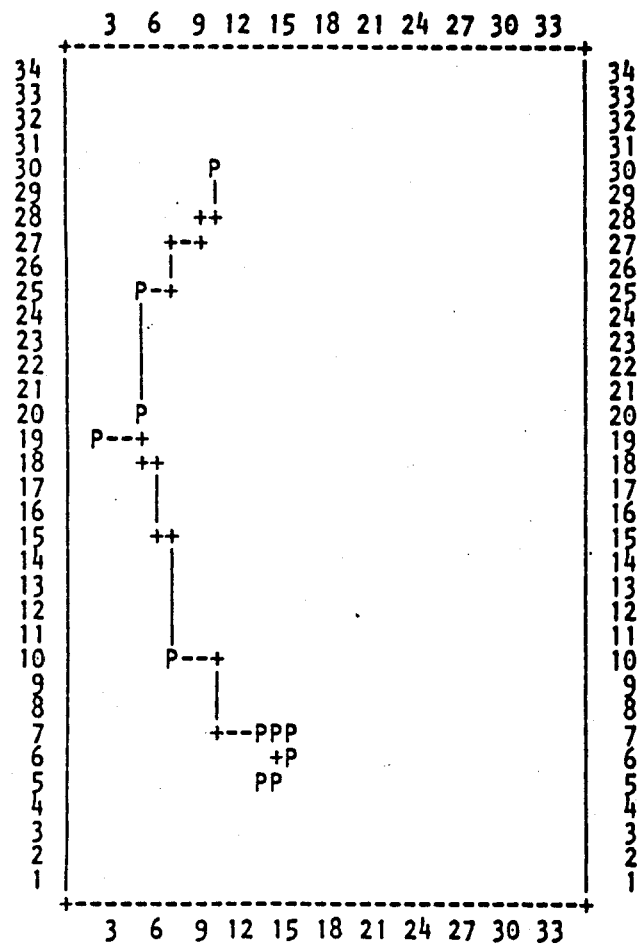
FIG. 49 shows the final wire path used from the initial zone of FIG. 47.

There were approximately 5000 nets and over 24,000 nodes in the problem herein dealt with. FIG. 47 shows the initial zone for one (net #164) of the 5000 nets. This would have contributed to the totals shown in FIGS. 17 and 18. FIG. 48 shows the net after the taking away process has been completed. This would have contributed to the final totals shown in FIGS. 19 and 20. FIG. 49 shows the final routing corresponding to net #164.

Figure 50:
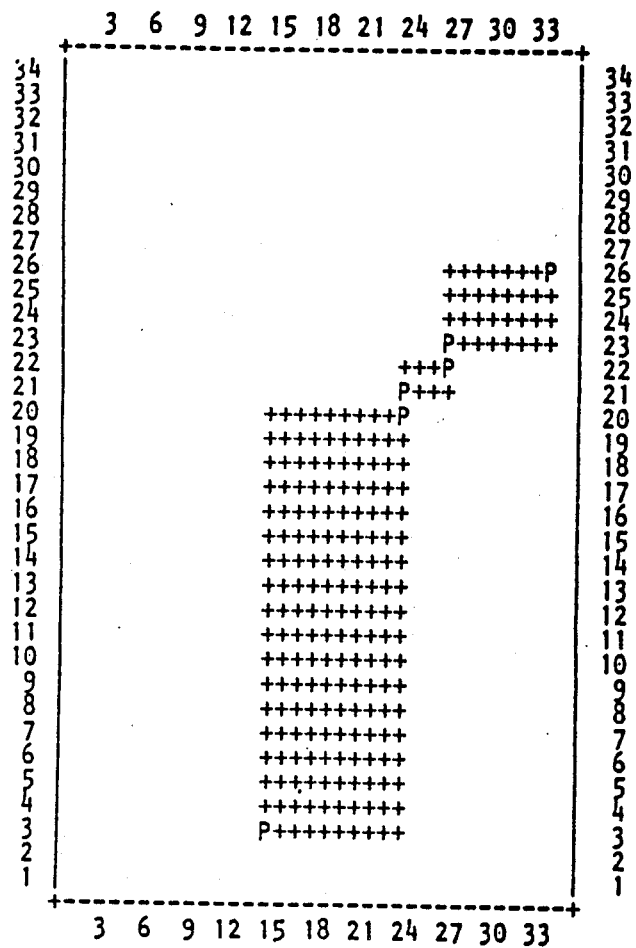
FIGS. 50, 51 and 52 correspond respectively to FIGS. 47, 48 and 49 using a second net.
Figure 51:
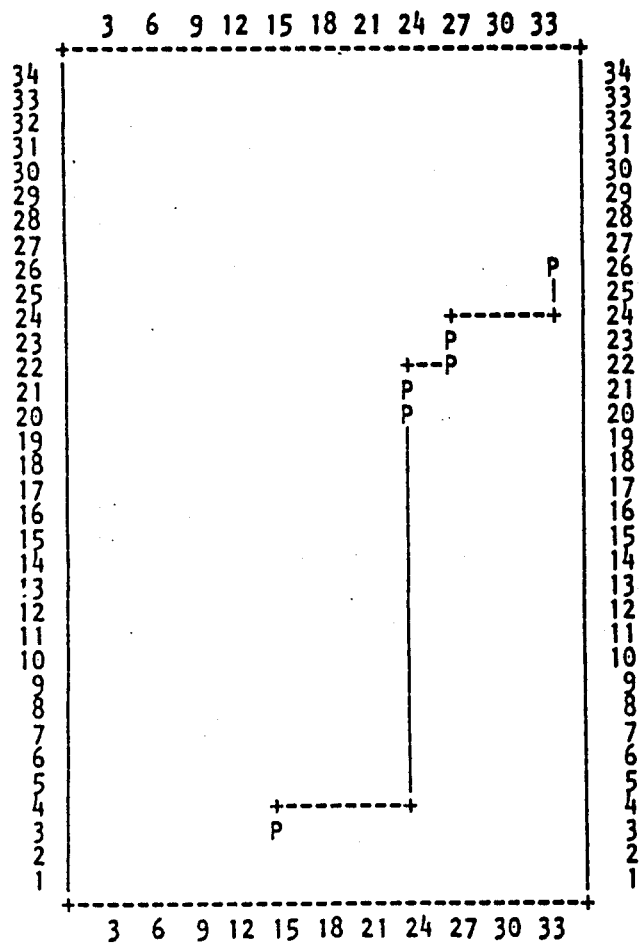
Figure 52:
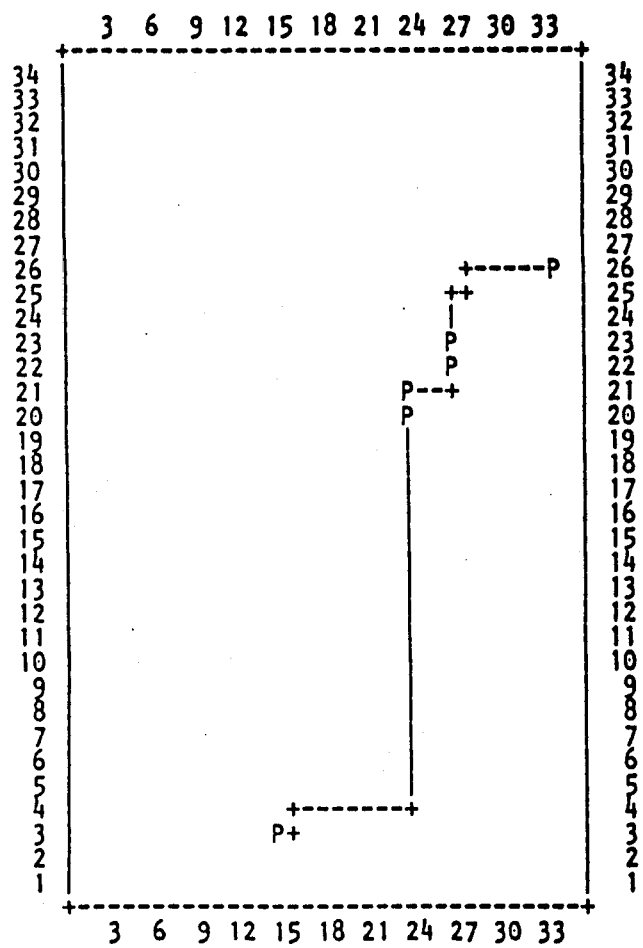
Figure 53:
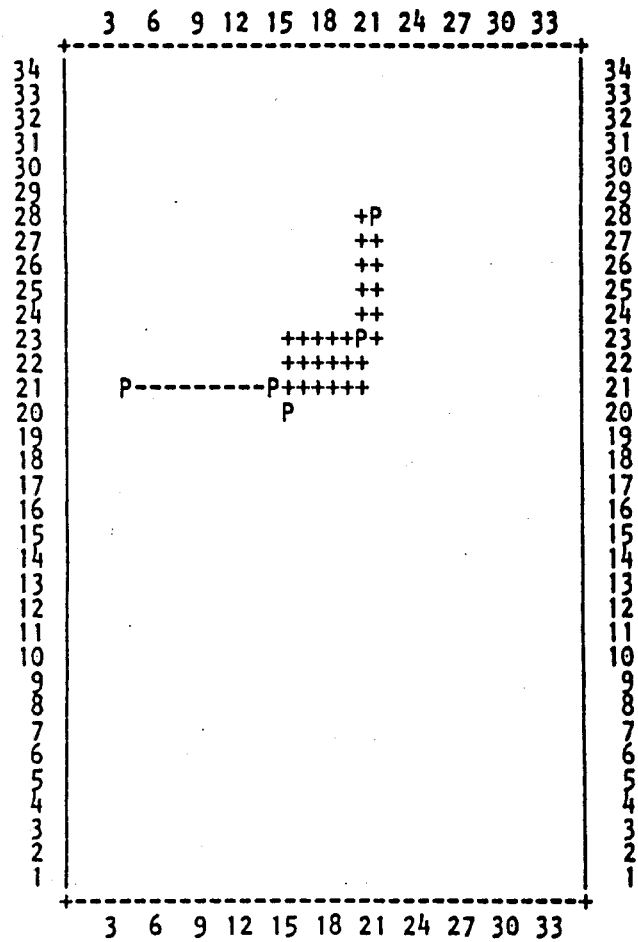
FIGS. 53, 54 and 55 correspond respectively to FIGS. 47, 48 and 49 for yet a third net.
Figure 54:
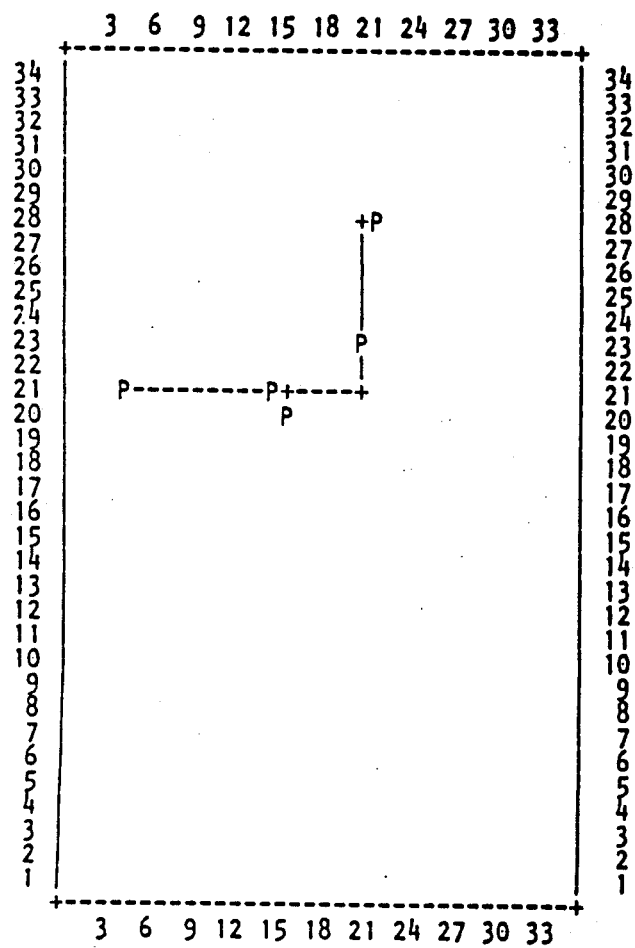
Figure 55:
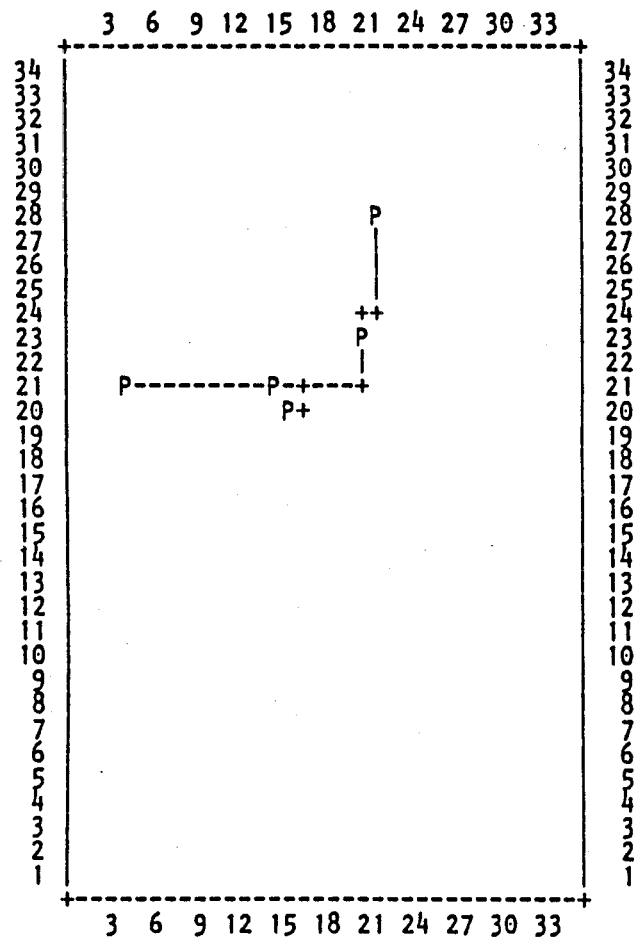
Figure 56A:
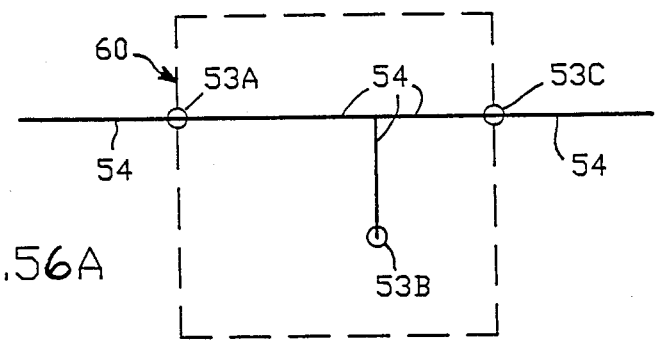
FIG. 56 is a schematic illustration of a selected area where demand for paths spaces exceeds supply.
Figure 56B:
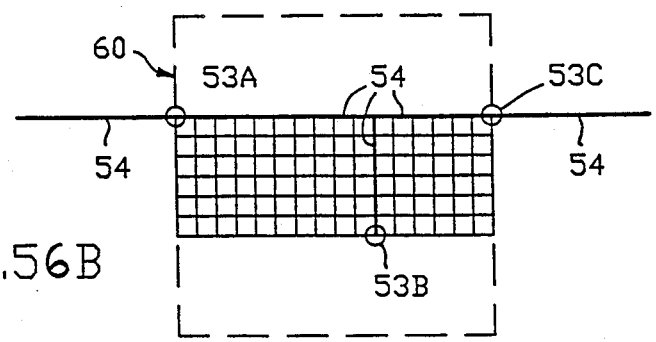

Notice, in FIG. 49, that although additional vias were eventually introduced, there is no unnecessary parallelism in this final routing. FIGS. 50, 51, and 52 show the same three stages for net 3409; and FIGS. 53, 54, and 55 show the same three stages for net 1985. The "p's" represent the nodes in the different nets. Also, for net 3409, although additional vias were introduced, no increase of minimum line length occurs (FIG. 52). For net 1985, a very slight parallelism was introduced (FIG. 55). For some nets, additional vias and additional wire lengths (non minimum wire lengths) were introduced; however, for a great many nets, there was, of course, no change from the final taking away process to the final routing. The three nets we have shown are typical of the lot. It can be seen that the methods of the invention have not only enabled the total elimination of overflows for the complete problem, they have also achieved efficient routings for the individual nets Shown in FIG. 56A is a selected area 60 where demand for path spaces exceeds supply even after the creation of initial zones and deletion of redundant paths from these initial zones. Also shown is path 54 and a sub-net containing nodes 53A, 53B and 53C. Node 53B is a node of a net that falls within selected area 60, while nodes 53A and 53C are nodes formed as points at the intersection of path 54 and the perimeter of the selected area. Shown in FIG. 56B is an expanded zone 55 and selected area 60 for the sub-net containing nodes 53A, 53B and 53C. The deletion of paths from the expanded zone is described above.

It is thought that the apparatus and method of the present invention and many of its attendant advantages will be understood from the foregoing description and it will be apparent that various changes may be made in the form, construction and arrangement of the parts thereof without departing from the spirit and scope of the invention or sacrificing all of its material advantages, the form herein before described being merely a preferred or exemplary embodiment thereof.

Having thus described our invention, what we claim as new and desire to secure by Letters Patents is:

1. A method for interconnecting nodes in each of a member of nets, comprising the steps of:
    (a) generating an initial zone for each net of said nets to be formed, said initial zone, for each net, being a corresponding first subset of a set of all paths which could be used for interconnecting all nodes of said each net, said corresponding first subset also being a corresponding second subset of a set of all segments which could be used for interconnecting said all nodes of said each net with each segment being a part of at least one minimum path of said corresponding first subset;
    (b) determining cumulative demand for path spaces created by all initial zones generated in step (a);
    (c) selecting a net of said nets;
    (d) selecting a number of redundant paths of an initial zone for said net selected step (c);
    (e) comparing said demand found in step (b) with the supply of available path spaces in an area used by said number of redundant paths selected in step (d);
    (f) determining a score for each of said redundant paths, said score being a function of at least said comparison of step (e);
    (g) deleting a redundant path from said initial zone for said net selected in step (c), said redundant path being one which has a worst score of any of said paths selected in step (d), no segment of a redundant path of said initial zone for said selected net being deleted if said segment is part of all minimum paths of said initial zone for said selected net;
    (h) repeat steps (c) through (g) selecting nets and paths and deleting paths until all redundant paths have been deleted from said each initial zone for all of said nets, said cumulative demand for path space being recalculated for each repetition of this step without including paths which were deleted in prior repetitions of step (g); and 2. A method as recited in claim 1, wherein an initial zone is generated with the number of redundant paths in one direction being greater than the number of redundant paths in another direction.

3. A method as recited in claim 1, wherein an initial zone has only minimum length paths.

4. A method for interconnecting nodes in each of a number of nets, comprising the steps of:
    (a) generating an initial zone for each net of said nets to be formed, said initial zone, for each net, being a corresponding first subset of a set of all paths which could be used for interconnecting all nodes of said each net, said corresponding first subset also being a corresponding second subset of a set of all segments which could be used for interconnecting said all nodes of said each net with each segment being a part of at least one minimum path of said corresponding first subset
    (b) determining cumulative demand for path spaces created by all initial zones generated in step (a);
    (c) comparing said cumulative demand found in step (b) with the supply of available path spaces;
    (d) determining a score for each path of paths of said initial zones, said score being a function of at least the comparison of step (c);
    (e) selecting a net of said nets;
    (f) deleting a redundant path of said paths from an initial zone of said initial zones for a net selected in step (e), said redundant path being one which has a worst said score of any of said paths in said initial zone, no segment of a redundant path of said initial zone for said selected net being deleted if said segment is part of all minimum paths of said initial zone for said selected net;
    (g) repeating steps (c) through (f) until each of the initial zones generated in step (a) has no redundant paths, said cumulative demand for path spaces being recalculated for each repetition of this step without including paths which were deleted in prior repetitions of step (f); and
    (h) interconnecting nodes of each net using available path spaces and paths, for each net, which paths remain undeleted after the completion of step (g).

5. A method for interconnecting nodes in each of a number of nets, comprising the steps of:
    (a) generating an initial zone for each net of said nets to be formed, said initial zone, for each net, being a corresponding first sunset of a set of all paths which could be used for interconnecting all nodes of said each net, said corresponding first subset also being a corresponding second subset of a set of all segments which could be used for interconnecting said all nodes of said each net with each segment being a part of at least one minimum path of said corresponding first subset;
    (b) determining cumulative demand for path spaces created by all initial zones generated in step (a);
    (c) selecting a net of said nets;

(d) selecting a number of redundant paths of an initial zone for said net selected in step (c);

(e) comparing said demand found in step (b) with the supply of available path spaces in a first area;

(f) determining a score for each of said redundant paths, said score being a function of at least said comparison of step (e);

(g) deleting a redundant path from said initial zone for said net selected in step (c), said redundant path being one which has a worst score of any of said paths selected in step (d), no segment of a redundant path of said initial zone for said selected net being deleted if said segment is part of all minimum paths of said initial zone for said selected net;

(h) repeat steps (c) through (g) selecting nets and paths and deleting paths until all redundant paths have been deleted from said each initial zone for all of said nets, said cumulative demand for path space being recalculated for each repetition of this step without including paths which were deleted in prior repetitions of step (g);

after having completed steps (a) through (h) and if demand for path spaces still exceeds the supply of available path spaces, the following additional steps are to be taken:

(i) selecting a second area where demand for path spaces still exceeds supply;

(j) generating an expanded zone on said second area for each sub-net, said expanded zone for each sub-net being any set of paths used to interconnect nodes of each sub-net, said expanded zone for each sub-net containing redundant paths, each said sub-net being that part of a net within said second area and also including nodes formed as points at the intersection of remaining paths and the perimeter of said second area, said remaining paths being paths remaining undeleted after completion of step (h);

(k) determining cumulative demand for path spaces in said second area;

(l) selecting a sub-net in said second area;

(m) selecting a number of redundant paths of said expanded zone for said sub-net selected in step (l);

(n) comparing said cumulative demand found in step (k) for path spaces with the supply of available path spaces in said second area;

(o) determining a score for each of the redundant paths selected in step (m), said score being a function of at least said comparison of step (n);

(p) deleting a path from said redundant paths selected in step (m), said path of this step being one which has a worst score as determined in step (o), no segment of a redundant path of said initial zone for said selected net being deleted if said segment is part of all minimum paths of said initial zone for said selected net;

(q) repeating steps (l) through (p) until each of said expanded zones generated in step (j) has no redundant paths, said cumulative demand for path spaces being recalculated for each repetition of this step without including paths which were deleted in prior repetitions of step (p);

(r) repeating steps (i) through (q) choosing areas wherein demand for path spaces still exceeds supply; and (s) interconnecting nodes of each net using available path spaces and paths remaining after step (r)

6. A method for interconnecting nodes in each of a number of nets, comprising the steps of:

(a) generating an initial zone for each net of said nets to be formed, said initial zone, for each net, being a corresponding first subset of a set of all paths which could be used for interconnecting all nodes of said each net, said corresponding first subset also being a corresponding second subset of a set of all segments which could be used for interconnecting said all nodes of said each net with each segment being a part of at least one minimum path of said corresponding first subset;

(b) determining cumulative demand for path spaces created by all initial zones generated in step (a);

(c) comparing said cumulative demand found in step (b) with the supply of available path spaces;

(d) determining a score for each path of paths of said initial zones, said score being a function of at least the comparison of step (c);

(e) selecting a net of said nets;

(f) deleting a redundant path of said paths from an initial zone, of said initial zones, for a net selected in step (e), said redundant path being one which has a worst said score of any of said paths in said initial zone, no segment of a redundant path of said initial zone for said selected net being deleted if said segment is part of all minimum paths of said initial zone for said selected net;

(g) repeating steps (c) through (f) until each of the initial zones generated in step (a) has no redundant paths, said cumulative demand for path spaces being recalculated for each repetition of this step without including paths which were deleted in prior repetitions of step (f);

after having completed steps (a) through (g) and if demand for path spaces still exceeds the supply of available path spaces, the following additional steps are to be taken:

(h) selecting an area where demand for path spaces still exceeds supply;

(i) generating an expanded zone on said area for each sub-net, said expanded zone for each sub-net being any set of paths used to interconnect nodes of each sub-net, said expanded zone for each sub-net containing redundant paths, each said sub-net being that part of a net within said area and also including nodes formed as points at the intersection of remaining paths and the perimeter of said area, said remaining paths being paths remaining undeleted after completion of step (g);

(j) determining cumulative demand for path spaces in said area, said cumulative demand being the path spaces needed in said area for expanded zones generated in step (i);

(k) comparing said cumulative path demand for spaces with the supply of available path spaces in said area;

(l) determining a score for each of the paths of said expanded zones generated in step (i), said score of this step being a function of at least the comparison of step (k);

(m) selecting a sub-net in said area;

(n) deleting a path from said expanded zone for said sub-net, said path being one which has a worst score as determined in step (l);

(o) repeating steps (k) through (n) until each of said expanded zones generated in step (i) has no redundant paths, said cumulative demand for path spaces being recalculated for each repetition of this step without including paths which were deleted in prior repetitions of step (n);

(p) repeating steps (h) through (o) choosing areas wherein demand for path spaces still exceeds supply; and (q) interconnecting nodes of each net using available path spaces and paths remaining after step (p).

7. A global wiring method for interconnecting nodes in each of a number of nets on a circuit chip, comprising the steps of:

(a) generating an initial zone for each net of said nets to be formed on said chip, said initial zone, for each net, being a corresponding first subset of a set of all paths which could be used for interconnecting all nodes of said each net, said corresponding first subset also being a corresponding second subset of a set of all segments which could be used for interconnecting said all nodes of said each net with each segment being a part of at least one minimum path of said corresponding first subset;

(b) determining cumulative demand for wire spaces created by all initial zones generated in step (a);

(c) selecting a net of said nets;

(d) selecting a number of redundant paths of an initial zone for said net selected in step (c);

(e) comparing said demand found in step (b) with the supply of available wire spaces in an area on said chip, said area being used by said number of redundant paths selected in step (d);

(f) determining a score for each of said redundant paths, said score being a function of at least said comparison of step (e);

(g) deleting a redundant path from said number of redundant paths from said initial zone for said net selected in step (c), said redundant path being one which has a worst score of any of said number of paths selected in step (d), no segment of a redundant path of said initial zone for said selected net being deleted if said segment is part of all minimum paths of said initial zone for said selected net;

(h) repeat steps (c) through (g) selecting nets and paths and deleting paths until all redundant paths have been deleted from said each initial zone for all of said nets, said cumulative demand for wire space being recalculated for each repetition of this step without including paths which were deleted in prior repetitions of step (g); and (i) interconnecting with electrical conductors nodes of each net using available wire spaces and paths remaining after step (h).

8. A global wiring method for interconnecting nodes in each of a number of nets on a circuit chip, comprising the steps of:

(a) generating an initial zone for each net of said nets to be formed on said chip, said initial zone, for each net, being a corresponding first subset of a set of all paths which could be used for interconnecting all nodes of said each net, said corresponding first subset also being a corresponding second subset of a set of all segments which could be used for interconnecting said all nodes of said each net with each segment being a part of at least one minimum path of said corresponding first subset;

(b) determining cumulative demand for wire spaces through cells on said chip created by all initial zones generated in step (a);

(c) comparing said cumulative demand found in step (b) with the supply of available wire spaces in each of said cells;

(d) determining a score for each path of paths of said initial zones, said score being a function of at least the comparison of step (c);

(e) selecting a net of said nets;

(f) deleting a redundant path from an initial zone for a net selected in step (e), said redundant path being one which has a worst said score of any of said paths in said initial zone for said net selected in step (e), to segment of a redundant path of said initial zone for said selected net being deleted if said segment is part of all minimum paths of said initial zone for said selected net;

(g) repeating steps (c) through (f) until each of the initial zones generated in step (a) has no redundant paths, said cumulative demand for wire spaces being recalculated for each repetition of this step without including paths which were deleted in prior repetitions of step (f); and (h) interconnecting nodes of each net to be formed on said chip using available path spaces and paths, for each net, which paths were not deleted after the completion of step (g).

9. A global wiring method for interconnecting nodes in each of a number of nets on a circuit chip, comprising the steps of:

(a) generating an initial zone for each net of said nets to be formed on said chip, said initial zone, for each net, being a corresponding first subset of a set of all paths which could be used for interconnecting all nodes of said each net, said corresponding first subset also being a corresponding second subset of a set of all segments which could be used for interconnecting said all nodes of said each net with each segment being apart of at least one minimum path of said corresponding first subset (b) determining cumulative demand for wire spaces through cells on said chip created by all initial zones generated in step (a);

(c) comparing said cumulative demand found in step (b) with the supply of available wire spaces in each of said cells;

(d) determining a score for each path of paths of said initial zones, said score being a function of at least the comparison of step (c):

(e) selecting a net of said nets;

(f) deleting a redundant path from an initial zone, of said initial zones, for a net selected in step (e), said redundant path being one which has a worst said score of any of said paths in said initial zone for said net selected in step, no segment of a redundant paths of said initial zone for said selected net being deleted if said segment is part of all minimum paths of said initial zone for said selected net (e);

(g) repeating steps (c) through (f) until each of the initial zones generated in step (a) has no redundant paths, said cumulative demand for wire spaces being recalculated for each repetition of this step without including paths which were deleted in prior repetitions of step (f); after having completed steps (a) through (h) and if demand for path spaces still exceeds the supply of available path spaces, the following additional steps are to be taken:

(h) selecting an area on said chip where demand for wire spaces still exceeds supply;

(i) generating an expanded zone on said area for each sub-net, said expanded zone for each sub-net being any set of paths used to interconnect nodes of each sub-net, said expanded zone for each sub-net containing redundant paths, each said sub-net being that part of a net within said area on said chip and also including nodes formed as points at the intersection of remaining paths and the perimeter of said area, said remaining paths being paths remaining undeleted after completion of step (g);

(j) determining cumulative demand for wire spaces through cells in said area on said chip, said cumulative demand being the wire spaces needed in each cell in said area on said chip for expanded zones generated in step (i);

(k) comparing said cumulative demand for wire spaces with the supply of available wire spaces in each cell in said area of said chip;

(l) determining a score for each of the paths of said expanded zones generated in step (i), said score of this step being a function of at least the comparison of step (k);

(m) selecting a sub-net in said area;

(n) deleting a path from said expanded zone for said sub-net selected in step (m), said path of this step being one which has a worst said score as determined in step (1) for any path of said sub-net selected in step (m), no segment of a redundant path of said initial zone for said selected net being deleted if said segment is part of all minimum paths of said initial zone for said selected net;

(o) repeating steps (j) through (n) until each of said expanded zones generated in step (i) has no redundant paths, said cumulative demand for wires spaces in said area being recalculated for each repetition of this step without including paths which were deleted in prior repetitions of step (n);

(p) repeating steps (h) through (o) choosing areas wherein demand for path spaces still exceeds supply; and (q) interconnecting nodes of each to be formed on said chip using available wire spaces and paths remaining after step

* * * * *

UNITED STATES PATENT AND TRADEMARK OFFICE
CERTIFICATE OF CORRECTION

PATENT NO. : 4,831,725
DATED : May 23, 1989
INVENTOR(S) : Bradford Dunham, Jerome B. Hickson, Jr. and Hirsh Lewitan It is certified that error appears in the above-identified patent and that said Letters Patent is hereby corrected as shown below:

Column 19, line 43, (claim 1), delete "member" and insert therefor --number--.

Column 20, after line 10, insert --(i) interconnecting nodes of each net using available path spaces and paths remaining after step (h).--

Column 20, line 28, (claim 4), after "subset" insert --;--

Column 21, line 57, (claim 5), change "(g)" to --(q)--.

Column 23, line 7, (claim 6), change "(g)" to --(q)--.

Signed and Sealed this

Seventh Day of July, 1992

Attest:

DOUGLAS B. COMER

*Attesting Officer*   *Acting Commissioner of Patents and Trademarks*